United States Patent
Michaeli et al.

(10) Patent No.: US 7,279,899 B2
(45) Date of Patent: Oct. 9, 2007

(54) CONTRAST FROM ROTATING FRAME RELAXATION BY ADIABATIC PULSES

(75) Inventors: Shalom Michaeli, St. Paul, MN (US); Michael G. Garwood, Medina, MN (US); Kamil Ugurbil, Minneapolis, MN (US); Dennis J. Sorce, Cockeysville, MD (US)

(73) Assignee: Regents of the University of Minnesota, St. Paul, MN (US)

( * ) Notice: Subject to any disclaimer, the term of this patent is extended or adjusted under 35 U.S.C. 154(b) by 0 days.

(21) Appl. No.: 11/244,815

(22) Filed: Oct. 6, 2005

(65) Prior Publication Data

US 2006/0244447 A1 Nov. 2, 2006

Related U.S. Application Data

(60) Provisional application No. 60/616,257, filed on Oct. 6, 2004.

(51) Int. Cl.
G01V 3/00 (2006.01)
(52) U.S. Cl. .................................. 324/318; 324/309
(58) Field of Classification Search ........ 324/300–322; 600/410–424
See application file for complete search history.

(56) References Cited

U.S. PATENT DOCUMENTS 5,256,967 A * 10/1993 Foo et al. ................. 324/311
5,274,331 A * 12/1993 Macovski ................. 324/309
5,404,882 A * 4/1995 Santyr ..................... 600/410
6,650,116 B2 * 11/2003 Garwood et al. .......... 324/309
6,717,405 B2 * 4/2004 Alsop ...................... 324/306
6,958,606 B2 * 10/2005 Le Roux .................. 324/309
7,053,618 B2 * 5/2006 Zhu ........................ 324/318
2002/0153889 A1 10/2002 Garwood et al.
2003/0052677 A1 3/2003 Pines et al.
2003/0069464 A1 4/2003 Muntermann
2003/0193332 A1 10/2003 Shah
2003/0218459 A1 11/2003 Reddy et al.
2003/0234647 A1 12/2003 Beaudoin et al.
2004/0051527 A1 3/2004 Mugler III, et al.
2004/0056659 A1 3/2004 Kupce
2004/0091937 A1 5/2004 Dalvit
2004/0162483 A1 8/2004 Kimura
2004/0181146 A1 9/2004 Yarnykh

OTHER PUBLICATIONS

Bendel, P., "Biomedical Applications of $^{10}$B and $^{11}$B NMR", *NMR in Biomedicine*, 18, (2005), 74-82.

Bloch, F., "Nuclear Induction", *Physical Review*, 70(7-8), (1946), 460-474.

Block, F., et al., "The Nuclear Induction Experiment", *Physical Review*, 70(7-8), (1946), 474-485.

Bradford, R., et al., "A Steady-State Transient Technique in Nuclear Induction", *Physical Review*, 84(1), (Oct. 1951), 157-160.

(Continued)

*Primary Examiner*—Brij B. Shrivastav
(74) *Attorney, Agent, or Firm*—Schwegman, Lundberg & Woessner, P.A.

(57) ABSTRACT

This document discusses, among other things, a system and method for modulating transverse and longitudinal relaxation time contrast in a rotating frame based on a train of radio frequency pulses.

30 Claims, 12 Drawing Sheets

OTHER PUBLICATIONS

Caldarelli, S., et al., "Pure-Phase Selective Excitation in NMR by Acquisition During the Pulse", *Journal of Magnetic Resonance, Series A*, 116(1), (Sep. 1995), 129-132.

Carr, J. C., et al., "Cline MR Angiography of the Heart With Segmented True Fast Imaging With Steady-State Precession", *Radiology*, 219(3), (2001),828-834.

Carr, H. Y., "Steady-State Free Precession in Nuclear Magnetic Resonance", *Physical Review*, 112(5), (Dec. 1, 1958), 1693-1708.

Dadok, J., et al., "Correlation NMR Spectroscopy", *Journal of Magnetic Resonance*, 13, (1974), 243-248.

Ernst, R. R., et al., "Application of Fourier Transform Spectroscopy to Magnetic Resonance", *The Review of Scientific Instruments*, 37(1), (1966), 93-102.

Ernst, R. R., "Magnetic Resonance With Stochastic Excitation", *Journal of Magnetic Resonance*, 3, (1970), 10-27.

Fagan, A. J., et al., "Development of a 3-D, Multi-Nuclear Continuous Wave NMR Imaging System", *Journal of Magnetic Resonance*, 176, (2005), 140-150.

Fieno, D. S., et al., "Physiological Basis foor Potassium ($^{39}$K) Magnetic Resonance Imaging of the Heart", *Circulation Research*, 84(8), (1999), 913-930.

Garwood, M., et al., "Symmetric Pulses to Induce Arbitrary Flip Angles With Compensation for rf Inhomogeneity and Resonance Offsets", *Journal of Magnetic Resonance*, 94, (Oct. 1, 1991), 511-525.

Garwood, M., et al., "The Return of the Frequency Sweep: Designing Adiabatic Pulses for Comtempory NMR", *Journal of Magnetic Resonance*, 153(2), (Dec. 2001), 155-177.

Hafner, S., "Fast Imaging in Liquids and Solids With the Back-Projection Low Angle ShoT (BLAST) Technique", *Magnetic Resonance Imaging*, 12(7), (1994),1047-1051.

Hahn, E. L., "Spin Echos", *Physical Review*, 80(1), (1950),580-594.

Hammarstrom, A., et al., "Improved Spectral Resolution in $^1$H NMR Spectroscopy by Homonuclear Semiselective Shaped Pulse Decoupling During Acquisition", *Journal of the American Chemical Society*, 116(19), (1994), 8847-8848.

Hwang, T.-L., et al., "Reduction of Sideband Intensifies in Adiabatic Decoupling Using Modulation Generated Through Adiabatic R-Variation (MGAR)", *Journal of Magnetic Resonance, Series A*, 121(3), (Aug. 1996), 221-226.

Kaiser, R., "Coherent Spectrometry With Noise Signals", *Journal of Magnetic Resonance*, 3(1), (1970), 28-43.

Ke, Y., et al., "Adiabatic DANTE Sequence for Bsub 1-Insensitive Narrowband Inversion", *Journal of Magnetic Resonance*, 96(3), (1992),663-669.

Lowe, I. J., et al., "Free-Induction Decays in Solids", *Physical Review*, 107(1), (1957), 46-61.

Madio, D. P., et al., "Ultra-Fast Imaging Using Low Flip Angles and FIDs", *MRM*, 34, (1995),525-529.

Nilgens, H., et al., "Hadamard NMR Imaging With Slice Selection", *Magnetic Resonance Imaging*, 14(7/8), (1996),857-861.

Ouwerkerk, R., et al., "Measuring Human Cardiac Tissue Sodium Concentrations Using Surface Coils, Adiabatic Excitation, and Twisted Projection Imaging With Minimal $T_2$ Losses", *Journal of Magnetic Resonance Imaging*, 21, (2005),546-555.

Pipe, J. G., "Spatial Encoding and Reconstruction in MRI with Quadratic Phase Profiles", *MRM*, 33(1), (Jan. 1995),24-33.

Purcell, E. M., et al., "Resonance Absorption by Nuclear Magnetic Moments in a Solid", *Physical Review*, 69(1-2), (1946),37-38.

Schmitt, P., e tal., "T-One Insensitive Steady State Imaging (TOSSI): Obtaining TrueFISP Images Wiht Pure T2 Contrast", *Proc. Intl. Soc. Mag. Reson. Med.*, 11, (2003),p. 551.

Torrey, H. C., "Transient Nutations in Nuclear Magnetic Resonance", *Physical Review*, 76(8), (1949),1059-1068.

Garwood, M., et al., "$T_{2P}$ Relaxation and Contrast in Human Brain Measured With Adiabatic Pulses", *ISMAR 2004 (15th Meeting)*, (2004),1 pg.

Gröhn, Olli H., et al., "Novel Magnetic Resonance Imaging Contrasts for Monitoring Response to Gene Therapy in Rat Glioma", *Cancer Research*, 63, (2003),7571-7574.

Jack, Jr., Clifford R., et al., "In Vivo Visualization of Alzheimer's Amyloid Plaques by Magnetic Resonance Imaging in Transgenic Mice Without a Contrast Agent", *Magnetic Resonance in Medicine*, 52, (2004),1263-1271.

Michaeli, S., et al., "Assessment of Dynamic Averaging From Transverse Relaxation in the Rotating Frame ($T_{2p}$) During Adiabatic HSn Pulses", *Proc. Intl. Soc. Mag. Reson. Med.* 11, (2004),1 pg.

Michaeli, Shalom, et al., "Exchange-Influenced $T_{2p}$ Contrast in Human Brain Images Measured With Adiabatic Radio Frequency Pulses", *Magnetic Resonance in Medicine*, 53, (2005),823-829.

Michaeli, Shalom, et al., "Transverse Relaxation in the Rotating Frame Induced by Chemical Exchange", *Journal of Magnetic Resonance*, 169(2), (2004),293-299.

Mikawa, Masahito, et al., "Paramagnetic Water-Soluble Metallofullerenes Having the Highest Relaxivity for MRI Contrast Agents", *Bioconjugate Chem.*, 12, (2001),510-514.

Senapati, L., et al., "Electronic Transport, Structure, and Energetics of Endohedral Gd@$C_{82}$ Metallofullerenes", *Nano Letters*, 4(11), (2004),2073-2078.

Senapati, L., et al., "Reply to Comment on Electronic Transport, Structure, and Energetics of Endohedral Gd@$C_{82}$ Metallofullerenes", *Nano Letters*, 5(11), (2005),2341 (1 pg.).

Tannus, Alberto, et al., "Improved Performance of Frequency-Swept Pulses Using Offset-Independent Adiabaticity", *Journal of Magnetic Resonance, Series A*, 120(1), (1996),133-137.

* cited by examiner

CONTRAST FROM ROTATING FRAME RELAXATION BY ADIABATIC PULSES

CROSS-REFERENCE TO RELATED APPLICATIONS

This document claims the benefit of priority, under 35 U.S.C. § 119(e), to Shalom Michaeli et. al, U.S. Provisional Patent Application Ser. No. 60/616,257, entitled "TRANSVERSE AND LONGITUDINAL RELAXATION TIME CONTRAST IN THE ROTATING FRAME GENERATED BY ADIABATIC RF PULSES," filed on Oct. 6, 2004, which is incorporated herein by reference.

GOVERNMENT INTEREST

This work was supported by NIH grants CA92004, RR08079, NS 40801, EB 00422, the Keck Foundation, the MIND Institute, the National Foundation for Functional Brain Imaging and the US Department of Energy. The United States government has certain rights in the technology disclosed herein.

TECHNICAL FIELD

This document pertains generally to magnetic resonance spectroscopy, and more particularly, but not by way of limitation, to contrast from rotating frame relaxation by adiabatic pulses.

BACKGROUND

Relaxation is a measure of the differences in the way that a molecule, such as water for example, relaxes following excitation. The relaxation rate constants of the spins located in different environments are different. A magnetic resonance image can be generated that is sensitive to the density of the water but in different tissues, the water concentration (or the density) changes little.

Relaxation provides a measure as to the environment in which the water molecule is located. For example, a water molecule excited by a radio frequency (RF) pulse gives energy off to the environment by interacting with other magnetic dipoles.

Among other factors, the rate constant depends on interaction between nearby molecules in the environment.

Longitudinal relaxation is characterized by time constant $T_1$, e.g. time constant at which a disturbed magnetic vector returns to alignment with a static magnetic field.

Transverse relaxation, or spin-spin relaxation, is characterized by a time constant $T_2$ at which the magnetization vector dephase in the plane perpendicular to the static magnetic field. The plane perpendicular to the static magnetic field is called the transverse plane.

Current methods for assessing relaxation and generating contrast in the rotating frame are inadequate.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION

Figure 1A:
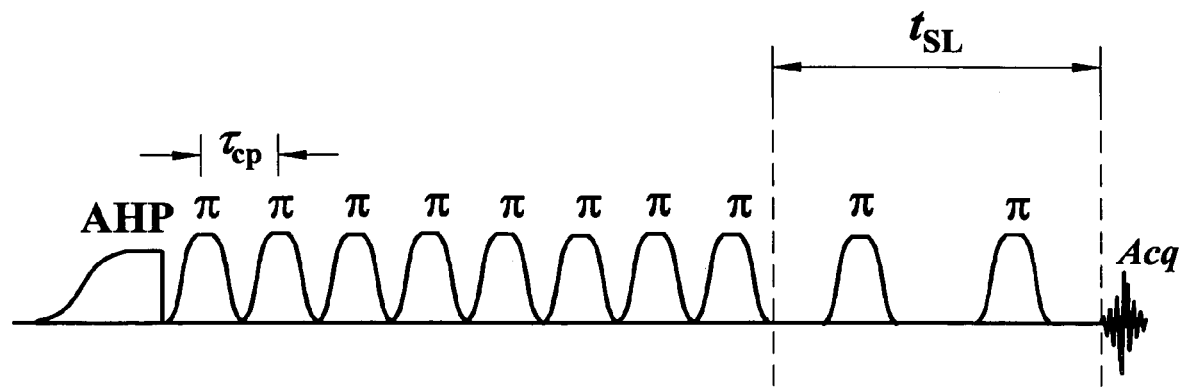
FIGS. 1A and 1B include schematic representations of the fully adiabatic CP and DSE pulse sequences.

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The embodiments may be combined, other embodiments may be utilized, or structural, logical and electrical changes may be made without departing from the scope of the present invention. The following detailed description is, therefore, not to be taken in a limiting sense, and the scope of the present invention is defined by the appended claims and their equivalents.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Transverse relaxation in the rotating frame ($T_{2\rho}$) is believed to be the dominant relaxation mechanism during an adiabatic Carr-Purcell (CP) spin-echo pulse sequence when no delays are used between pulses in the CP train. The exchange-induced and dipolar interaction contributions ($T_{2\rho}$, $_{ex}$ and $T_{2\rho,dd}$) depend on the modulation functions of the adiabatic pulses used. Adiabatic pulses having different modulation functions can be used to generate $T_{2\rho}$ contrast in images. In one example, images of the human occipital lobe are generated at magnetic field of 4T. $T_{2\rho}$ time constants can be measured using an adiabatic CP pulse sequence followed by an imaging readout. In one example, adiabatic full passage pulses of the hyperbolic secant HSn (n=1 or 4) family having significantly different amplitude modulation and frequency modulation functions were used with no time delays between pulses. A dynamic averaging (DA) mechanism (e.g. chemical exchange and diffusion in the locally different magnetic susceptibilities) provides a partial explanation to describe differences in brain tissue water proton $T_{2\rho}$ time constants. Measurements of the apparent relaxation time constants ($T_2^\dagger$) of brain tissue water as a function of the time between centers of pulses ($\tau_{cp}$) at 4T and 7T permits separation of the DA contribution from that of dipolar relaxation. In various examples, a method is presented for assessing $T_{2\rho}$ relaxation influenced by DA in tissue, and also means to generate $T_{2\rho}$ contrast in MRI.

Chemical exchange (CE) between spins located at different magnetic sites with different chemical shifts or diffusion of spins through magnetic field inhomogeneities contribute to transverse relaxation in vivo. Collectively, these relaxation processes are referred to here as dynamic averaging (DA). Dephasing due to molecular diffusion in microscopic susceptibility gradients or CE occurs for example around paramagnetic proteins, organelles, and capillaries. The apparent transverse relaxation time constant ($T_2^\dagger$) decrease due to DA can be used for in vivo quantification of brain iron because of its relevance to several neurodegenerative disorders including Parkinson's and Alzheimer's disease as well as for understanding the mechanisms of blood oxygenation level dependent (BOLD) contrast. The model of $T_2^\dagger$ decrease due to DA describes transverse relaxation induced by paramagnetic complexes and also relaxation in blood.

Proton relaxation studies are motivated by the importance of relaxation-based contrast in clinical applications of MR imaging and spectroscopy. An exemplary contrast method is based on the fully adiabatic Carr-Purcell (CP) technique. The dependence of the $T_2^\dagger$ values of human brain tissue water and cerebral metabolite N-acetylaspartate and total creatine proton signals on the temporal spacing ($\tau_{cp}$) of pulses in the CP train at high magnetic fields (4T and 7T) may reflect DA. In one example, relaxation techniques were used to generate contrast for monitoring response to gene therapy in rat glioma and for investigating the acute cerebral ischaemia in rats.

Rotating frame transverse relaxation (time constant, $T_{2\rho}$) dominates during adiabatic pulses used in a CP pulse sequence. A theory is presented for the two-site-exchange (2SX)-induced $T_{2\rho}$ contribution ($T_{2\rho,ex}$) from a system of otherwise identical spins with a nonzero chemical shift difference ($\delta\omega \neq 0$) in the fast chemical exchange limit (FXL). $T_{2\rho,ex}$ and the $T_{2\rho}$ contribution from dipolar interactions ($T_{2\rho,dd}$) with rotational correlation times $\tau_c > 10^{-9}$s during adiabatic pulses depends on the frequency modulation and amplitude modulation functions used for the adiabatic pulses. $T_{2\rho}$ measurements using adiabatic full-passage (AFP) pulses, such as hyperbolic secant HSn (n=1 or 4) pulses provides a method for determining chemical exchange rate constants. The present adiabatic CP method generates tissue contrast originating in $T_{2\rho}$ mechanisms.

$T_{2\rho}$ contrast in human brain tissue $^1H_2O$ MRI is generated by using AFP HS1 and HS4 pulses. Theoretical formalisms for $T_{2\rho,ex}$ and $T_{2\rho,dd}$ can be used to quantify the observed contrast. In one example, $T_2^\dagger$ measurements of water in brain tissue are generated as a function of the temporal spacing, $\tau_{cp}$, of HSn pulses in the CP pulse sequence at 4T and 7T field strengths.

Consider first the relaxations during the interpulse time intervals ($\tau_{ip}$) in an adiabatic CP pulse sequence and during the AFP pulses. First, relaxation during the adiabatic pulses is described.

Transverse Relaxations during the Adiabatic Pulses

During AFP pulses in a CP train, the transverse relaxation is dominated by $T_{2\rho}$. Because the effective magnetic field, $\omega_{eff}(t)$, is time dependent during the adiabatic rotation, $T_{2\rho}$ is also time dependent and thus is a function of the pulse modulation functions, $\omega_1(t)$ and $\omega_{RF}(t)$. Here, $\omega_1(t)$ is the time-dependent RF amplitude and $\omega_{RF}(t)$ is time-dependent frequency of the pulse in rad/s. The amplitude of HSn pulses are given by:

$$\omega_1(t) = \omega_1^{max} \text{sech}[\beta[2t/T_p - 1]^n], \qquad \text{Eq. 1}$$

where $t \in [0, T_p]$, $\beta$ is a truncation factor (sech($\beta$)=0.01), $\omega_1^{max}$ is the maximum value of $\omega_1(t)$ in rad/s, $T_p$ is the pulse duration, and n=1 and 4 for HS1 and HS4 pulses, respectively. As n gets larger, the amplitude-modulation functions of the HSn pulses become flatter and time evolution of magnetization significantly changes with the change of n. With respect to the carrier frequency $\omega_c$ (the center frequency in the bandwidth of interest), the frequency modulation for HS1 pulse is given by:

$$\omega_{RF}(t) - \omega_c = A \tan h[\beta[2t/T_p - 1]], \qquad \text{Eq. 2}$$

and for the HS4 pulse is given by:

$$\omega_{RF}(t) - \omega_c = A \int_0^t \text{sech}^2(\beta(2t'/T_p - 1)^4) dt', \qquad \text{Eq. 3}$$

where A is the amplitude of the frequency sweep in rad/s. During AFP pulses, $\omega_{eff}(t)$ changes its orientation at the instantaneous angular velocity, $d\alpha(t)/dt$, with:

$$\alpha(t) = \tan^{-1}\left(\frac{\omega_1(t)}{\Delta\omega(t)}\right), \qquad \text{Eq. 4}$$

where $\Delta\omega(t) = (\omega_0 - \omega_{RF}(t))$ and $\omega_0$ is the Larmor frequency. The effective field during an adiabatic pulse is given by:

$$\omega_{eff}(t) = \sqrt{\omega_1^2(t) + \Delta\omega^2(t)}. \qquad \text{Eq. 5}$$

For a system of two equivalent nuclei in a single site, the instantaneous rotating frame transverse relaxation rate constant due to dipolar interactions is given by:

$$R_{2\rho,dd} = \frac{1}{(40k_{dd})} \left[ 3(3\cos^2\alpha - 1)^2 + \frac{30\sin^2\alpha\cos^2\alpha}{1 + \omega_{eff}^2\tau_c^2} + \frac{3\sin^4\alpha}{1 + 4\omega_{eff}^2\tau_c^2} + \frac{(20 - 6\sin^2\alpha)}{1 + \omega_0^2\tau_c^2} + \frac{(8 + 12\sin^2\alpha)}{1 + 4\omega_0^2\tau_c^2} \right] \quad \text{Eq. 6}$$

where $$\frac{1}{k_{dd}} = 2I(I+1)\hbar^2\gamma^4 r^{-6} r^{-6} \tau_c.$$

Here r is the inter-nuclear distance and h is Planck's constant. Eq. 6 can be used to calculate $R_{2\rho,dd}$ during AFP pulses.

The rotating frame 2SX transverse relaxation for spin populations with $\delta\omega \neq 0$ (the anisochronous mechanism) can be derived. The instantaneous exchange-induced transverse relaxation rate constant in the FXL ($\tau_{ex}^{-1} \gg \delta\omega$) during the adiabatic pulses can be approximated as in Equation 7:

$$R_{2\rho,ex} = P_A P_B (\delta\omega)^2 \cos^2\alpha \tau_{ex}, \quad \text{Eq. 7}$$

where $P_A$ and $P_B$ are the fractional spin populations at sites A and B, and $\tau_{ex}$, is the correlation time for exchange ($=(\tau_A^{-1}+\tau_B^{-1})^{-1}$). Note that $R_{2\rho,ex}$ is single-valued only in the FXL.

A possible mechanism of the relaxations in tissue is CE between spins with $\delta\omega=0$ (the isochronous case). This situation can be described for free precession. For the 2SX case (between site A and site B) in the slow and intermediate exchange regimes, the signal intensity (SI) decay is described by biexponentiality (e.g., the sum of two exponential functions: the coefficients are equal to the populations of sites A and B and the relaxation rate constants equal to $(1/T_{2A}+1/\tau_A)$ and $(1/T_{2B}+1/\tau_B)$, when $T_{2A} \neq T_{2B}$, and when the system is in the slow-exchange-limit, SXL). Here $T_{2A}$ and $T_{2B}$ are the transverse relaxation rate constants of the sites A and B in the absence of chemical exchange. In this case, the FXL obtains only if the rate constant characterizing the exchange kinetics, $\tau_{ex}^{-1}$, is also sufficiently greater than the transverse relaxographic shutter-speed, $|R_{2A}-R_{2B}|$, where $R_{2A} \equiv T_{2A}^{-1}$ and $R_{2B} \equiv T_{2B}^{-1}$. In the FXL, the relaxation is governed by the monoexponential decay function with the relaxation rate constant:

$$R_2 = R_{2A} P_A + R_{2B} P_B \quad \text{Eq. 8}$$

Transverse relaxation rate constants $R_{2A,B}$ denote relaxation other than CE such as dipolar interactions or cross-relaxations. Under RF irradiation, transverse relaxation due to cross-relaxations differs from the relaxation during free precession.

To calculate the average effective relaxation rate constant $\bar{R}_{2\rho}$ during an AFP pulse of length $T_p$, all instantaneous contributions during the pulse are taken into account and the average relaxation rate constant is determined by:

$$\bar{R}_{2\rho} = \frac{1}{T_p} \int_0^{T_p} R_{2\rho,ex}(t)dt + \frac{1}{T} \int_0^{T_p} R_{2\rho,dd}(t)dt. \quad \text{Eq. 9}$$

Theory predicts both the $R_{2\rho,ex}$ and $R_{2\rho,dd}$ rate constants to be dependent on the choice of amplitude modulation and frequency modulation functions for the adiabatic pulses via their $\alpha$- and $\omega_{eff}$ dependencies.

Transverse Relaxations during the Interpulse Time Intervals

Relaxation during the interpulse time interval $\tau_{ip}$ is independent of the RF pulse parameters. The Luz-Meiboom CE theory, derived originally in the Redfield limit, that describes the $T_2^\dagger$ decrease during the CP pulse sequence caused by CE between spins with different chemical shifts $\delta\omega$, e.g., the anisochronous 2SX mechanism, was generalized to include a diffusion process. The transverse relaxation rate constant is given by:

$$R_{2,DA} = (\delta\omega)^2 P_A P_B \tau \left\{ 1 - (2\tau/\tau_{ip}) \tanh\left(\frac{\tau_{ip}}{2\tau}\right) \right\} \quad \text{Eq. 10}$$

Here $\tau = \tau_{ex}$ or $\tau_d$, where $\tau_d$ is diffusion correlation time. When DA is not the only relaxation mechanism and additional relaxation pathways are operative, the relaxation rate constant is given by:

$$R_2 = R_{2,DA} + R_2^0 \quad \text{Eq. 11}$$

Here, $R_2^0$ describes the other relaxation mechanisms, such as dipolar interaction or cross-relaxation. This theory allows determination of the $\tau$, $P_A P_B (\delta\omega)^2$, and $R_{2,DA}$ values. Because $R_{2\rho,dd}$ is virtually independent of magnetic field strength between 4T and 7T and $R_{2,DA}$ is significantly magnetic field strength dependent, measurements of the transverse relaxation rate constants at different static magnetic field strengths allows separation of the $R_{2,DA}$ and $R_2^0$ contributions to $R_2$.

Transverse Relaxations during the Entire Fully Adiabatic CP Pulse Sequence

Signal intensity decay during the adiabatic CP pulse sequence can be described by the exponential decay functions during the pulses and during the interpulse time intervals with the rate constants $R_{2\rho}(t)$ and $R_2$, respectively:

$$SI(n) = S_0 \exp(-\bar{R}_{2\rho} m T_p) \exp(-R_2 m \tau_{ip}), \quad \text{Eq. 12}$$

where m is a number of pulses in the adiabatic CP train and $\tau_{ip} = \tau_{cp} - T_p$. From Eq. 12 the general expression for the relaxation rate constant during the adiabatic CP pulse sequence can be derived and expressed as:

$$R_2^* = \{\bar{R}_{2\rho} - R_2\} \frac{T_p}{\tau_{cp}} + R_2. \quad \text{Eq. 13}$$

Eq. 13 predicts that with no time delays between adiabatic pulses (i.e., $\tau_{cp} = T_p$) relaxation is governed by $T_{2\rho}$ relaxation.

EXAMPLE

In one example, MRI studies were performed on healthy volunteers using instruments having Varian Unity INOVA consoles (Varian Associates, CA, USA) interfaced to a 90 cm bore 4T magnet (OMT, Inc., Oxon, UK) and to a 90 cm bore 7T magnet (Magnex Scientific, UK). $^1$H quadrature surface coils consisting of two geometrically decoupled turns (each 7 cm in diameter) were used for the measurements. $T_{2\rho}$ and $T_2^\dagger$ images were measured with a segmented spiral readout, using (0.7 mm)$^2$ in-plane resolution, FOV= (18 cm)$^2$, 256$^2$ matrix, 8 segments, acquisition time (AT)=35 ms, and thickness=3 mm. Shimming was performed with a fully adiabatic version of the fast automatic shimming technique by mapping along projections, FASTMAP. Before the excitation pulse in the sequences, the fat signal at 1.3 ppm was suppressed by variable-power RF pulses with optimized relaxation delays, VAPOR. Two dummy scans were used to achieve a steady state prior to data collection.

$T_{2\rho}$ measurements were performed using variable numbers of HS1 or HS4 pulses in the CP-train of the fully adiabatic pulse sequence, denoted CP$^{HS1}$ and CP$^{HS4}$, respectively (FIG. 1A). In the figure, selection gradients and the spiral readout are not shown and the segment which remains constant during $T_2$ measurements is denoted by $t_{SL}$.

Figure 1B:
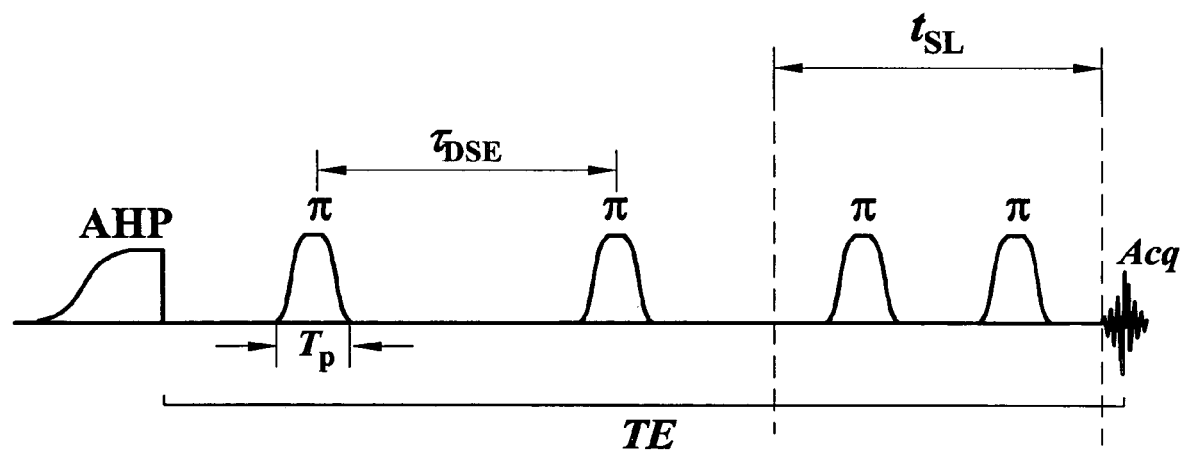

Each AFP pulse had an adiabaticity factor R equal to 20 ($\equiv AT_p/\pi$) with $T_p$ set to 3 ms. The RF field amplitude $\omega_1^{max}/2\pi$=2.5 kHz in all measurements. For the $T_{2\rho}$ measurements, five subjects were scanned with no delays between AFP pulses in the CP-train. In one example, $T_{2\rho}$ measurements, $T_2^\dagger$ were measured with a double spin echo (DSE) pulse sequence (FIG. 1B), using the same TE values in both pulse sequences. In the DSE pulse sequence, two HS1 pulses were used prior to slice-selection, and various TE values were obtained by incrementing the time between centers of the pulses, $\tau_{DSE}$. In the CP pulse sequence, various echo times were achieved by incrementing the number of pulses in the CP-train with pulse phases set according to MLEV-4. Slice-selection was performed with two HS1 pulses applied in the presence of slice selection gradients, and non-selective excitation was performed with an adiabatic half-passage (AHP) pulse. TE was varied (five TE values) between 22.2 and 72.2 ms, and TR=7 s was used. The RF energy deposited by CP train varied with the number of AFP pulses in the CP train and was kept below the FDA limit. $T_{2\rho}$- and $T_2^\dagger$-maps from these measurements were generated using the MATLAB software package (MATLAB 6.1, Mathworks, MA), fitting the signal intensities to a monoexponential decay.

The $\tau_{cp}$ dependence of the $T_2^\dagger$ time constants at 4T (6 subjects) and 7T (5 subjects) was investigated using the CP$^{HS1}$ pulse sequence. The length of the CP train was incremented keeping $\tau_{cp}$ constant throughout the sequence. Because TR of the pulse sequence was constant during the acquisition and TE was varied significantly when the measurements were performed with long $\tau_{cp}$, the longitudinal relaxation process was also taken into account. Possible contamination by CSF can also influence the measurements of $T_2^\dagger$. Thus, the estimations of $T_2^\dagger$ were performed using a bi-exponential decay function:

$$SI = A_1 \exp(-TE/T_2^\dagger) + A_2 \exp(-TE/T_L).  \quad \text{Eq. 14}$$

Here $T_L$ spans the values of the transverse relaxation time constants of CSF $^1$H$_2$O and includes the longitudinal relaxation time constant $T_1$, of the brain tissue $^1$H$_2$O. To estimate the variations of the fast component of the bi-exponential decay (attributed to the $T_2^\dagger$ of brain tissue) with the change of the $T_L$, the assumed relaxation time constant $T_L$ was varied in the range 0.5-2.5 s. Within the range of $T_L$ examined, the average change of the $T_2^\dagger$ of brain tissue was within ±3.3% and the estimation of the δω varied within 2%.

Figure 2A:
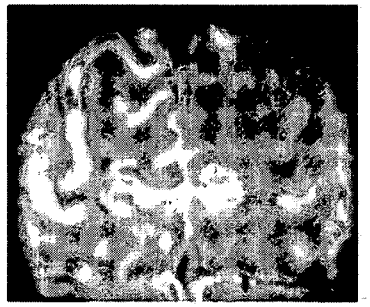
FIGS. 2A-2E illustrate experimental image results for different pulse trains.
Figure 2B:
Figure 2C:
Figure 2D:
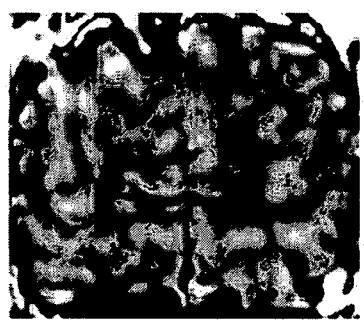
Figure 2E:

FIGS. 2A-2E illustrate images including (2A) using CP$^{HS1}$, (2B) CP$^{HS4}$, (2C) and DSE images detected at TE=72.2 ms at 4T using spiral readout. FIG. 2D illustrates a relative difference image, generated by subtracting the CP$^{HS1}$ image of FIG. 2A from the CP$^{HS4}$ image of FIG. 2B and then normalizing to the CP$^{HS1}$ image. FIG. 2E illustrates a relative difference image, generated by subtracting the DSE image of FIG. 2C from the CP$^{HS1}$ image of FIG. 2A and then normalizing to the DSE image.

In particular, FIGS. 2A and 2B show coronal high-resolution images acquired at 4T from the occipital lobe of a representative subject, using CP pulse sequences with segmented spiral readout. Images were acquired at TE=72.2 ms. Measurements were performed using HS4 (FIG. 2A) and HS1 (FIG. 2B) AFP pulses in the CP train. Because no delays between pulses were used, the relaxation was governed solely by $T_{2\rho}$ processes. In FIG. 2C, the image acquired with the DSE pulse sequence (FIG. 1B) at TE=72.2 ms is shown. Relative difference images are presented in FIGS. 2D and 2E. The image in FIG. 2D was obtained by subtracting the CP$^{HS1}$ image from the CP$^{HS4}$ image and then normalizing by the CP$^{HS1}$ image. This difference indicates change in the $T_{2\rho}$ time constants due to the difference in the modulation functions of the AFP pulses used and reveals contrast generated solely by $T_{2\rho}$ relaxation. The image shown in FIG. 2E was obtained by subtracting the DSE image from the CP$^{HS1}$ image and then normalizing to the DSE image. This image contains contributions from both $T_{2\rho}$ and $T_2$ (free precession transverse relaxation time constant during the interpulse time intervals). Because of the simultaneous contribution of relaxation mechanisms that are differently weighted, the interpretation of contrast observed in FIG. 2E is more complicated than that in FIG. 2D, and data analysis requires separate considerations of $T_{2\rho}$ during the AFP pulses and $T_2$ during the free precession periods $\tau_{ip}$.

When the interpulse time intervals are varied to achieve the different TEs with a constant number of AFP pulses, the $T_{2\rho}$ relaxation imposes a constant weighting on the $T_2^\dagger$ measurements. This is also the case with the DSE measurements. On the other hand, when $T_2^\dagger$s are measured with the adiabatic CP pulse sequence having different $\tau_{cp}$ values and incrementing the number of pulses in the train, both relaxation pathways (e.g. $T_{2\rho}$ and relaxation during free precession) contribute to the measurements of $T_2^\dagger$.

Figure 3A:
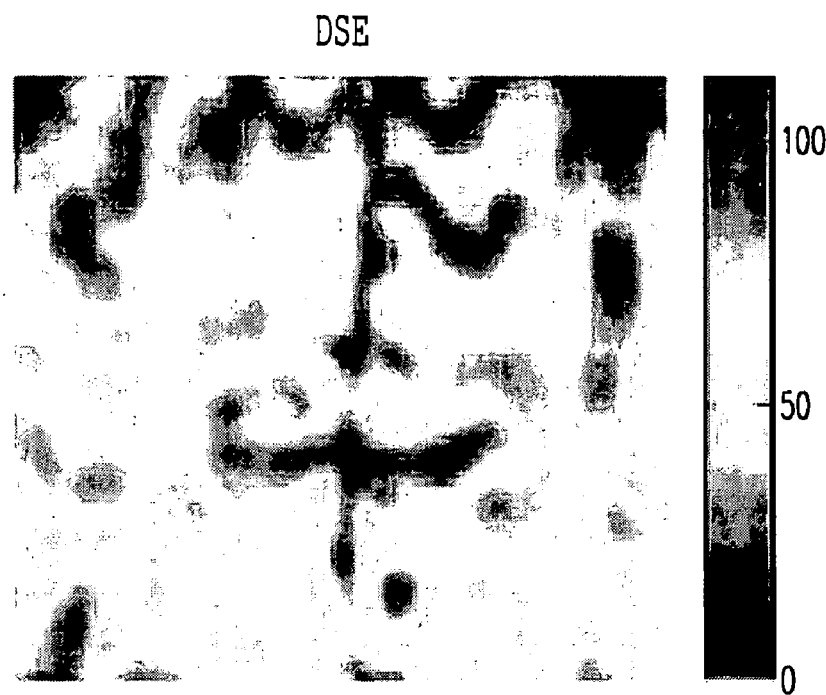
FIGS. 3A-3D illustrate apparent $T_2^\dagger$ data generated from the single-subject measurements.
Figure 3B:
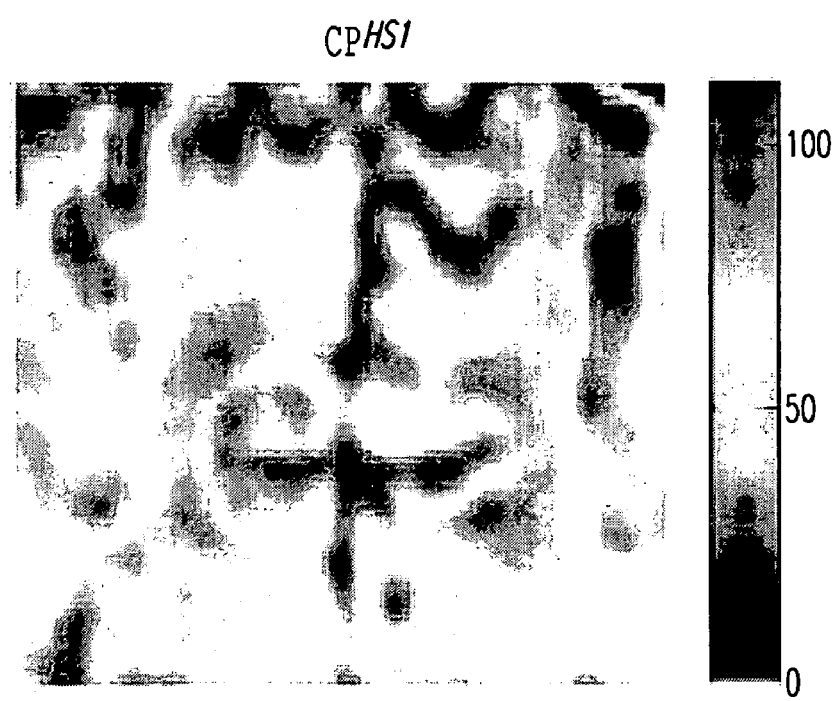
Figure 3C:
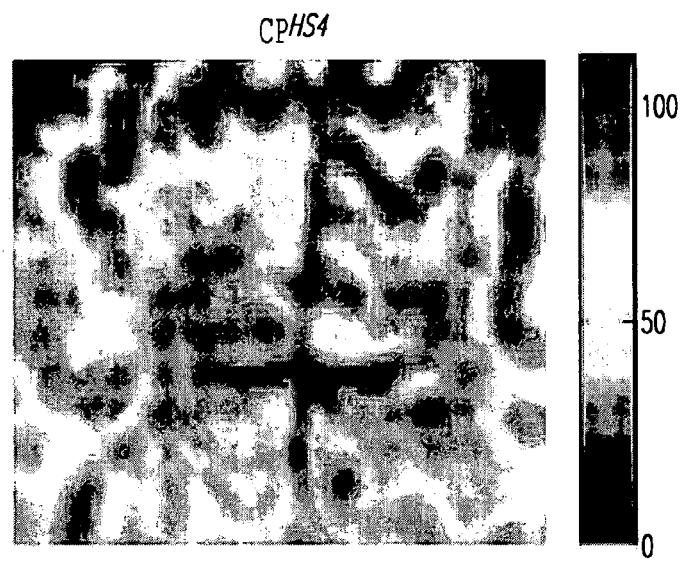
Figure 3D:
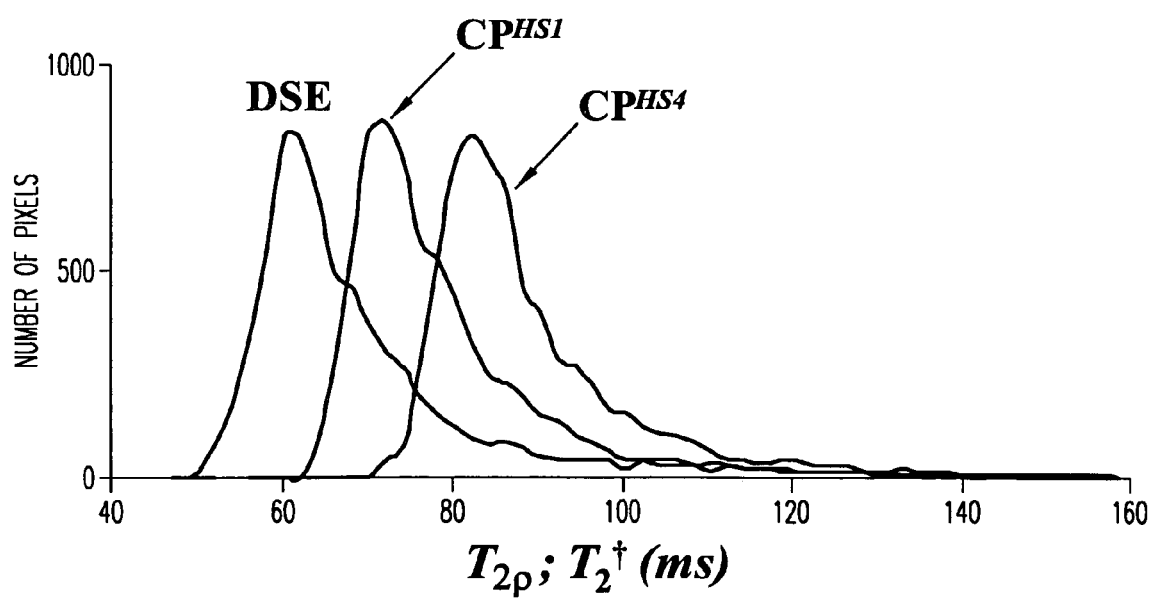

$T_{2\rho}$ and $T_2^\dagger$ maps from the same region of interest from single subject measurements are presented in FIGS. 3A, 3B and 3C. In particular, FIGS. 3A-3D illustrate $T_2^\dagger$-maps generated from the single-subject measurements, detected with the (3A) DSE, (3B) CP$^{HS1}$ and (3C) CP$^{HS4}$ pulse sequences. FIG. 3D illustrates the $T_2^\dagger$ and $T_{2\rho}$ relaxograms of a human brain image slice in the occipital lobe, generated from $T_2^\dagger$ and $T_{2\rho}$ maps. $T_{2\rho}$ images were obtained with no time delays between AFP in the CP pulse train. $T_2^\dagger$ images were measured with the DSE pulse sequence using a variable interpulse time interval.

The averaged intersubject results (MEAN±SD) of the $T_{2\rho}$ measurements from brain tissue regions are summarized in Table 1. Inspection of this table reveals an increase in the $T_{2\rho}$ measured when HS4 versus HS1 pulses were used (p<0.03), with a ratio of $T_{2\rho}(CP^{HS4})/T_{2\rho}(CP^{HS1})=1.18$ (multisubject data, n=5, Table 1). For exchange-induced $T_{2\rho,ex}$ obtained from the anisochronous water/ethanol mixture with $CP^{HS1}$ and $CP^{HS4}$ pulse sequences, the ratio $T_{2\rho,ex}(CP^{HS4})/T_{2\rho,ex}(CP^{HS1})$ was ~1.5 when using the same RF amplitude ($\omega_1^{max}/2\pi=2.5$ kHz). A value of $T_{2\rho}(CP^{HS4})/T_{2\rho}(CP^{HS1})=1.18$ measured here suggests that relaxation pathways other than the anisochronous DA must contribute to $^1H_2O$ transverse relaxation in the brain.

TABLE 1

Averaged calculated $T_{2\rho}$ (detected with $CP^{HS1}$ and $CP^{HS4}$) and $T_2^\dagger$ (detected with DSE) time constants of brain tissue at 4T

| Pulse Sequences | $CP^{HS1}$ | $CP^{HS4}$ | DSE | $CP^{HS4}/CP^{HS1}$ | $CP^{HS1}/DSE$ |
|---|---|---|---|---|---|
| $T_{2\rho}, T_2^\dagger$ | 72.8 ± 3.1[a] | 86 ± 3.4[b] | 59.2 ± 2.4[b] | 1.18 | 1.23 |

[a]Significant difference between $CP^{HS1}$ and $CP^{HS4}$ (p < 0.03, two-tailed).
[b]Significant difference between $CP^{HS1}$ and DSE (p < 0.01, two-tailed).

Figure 4A:
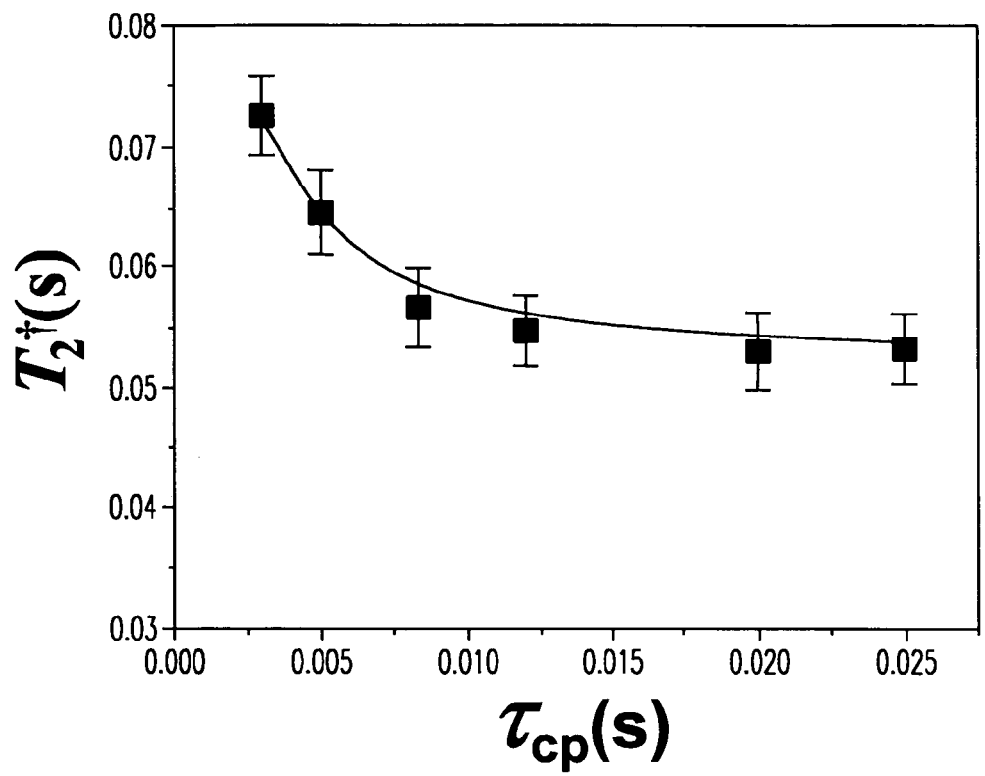
FIGS. 4A and 4B illustrate averaged calculated $T_2^\dagger$ time constants at 4T (6 individuals) and at 7T (5 individuals) as a function of $\tau_{cp}$ and the superimposed simulations.
Figure 4B:
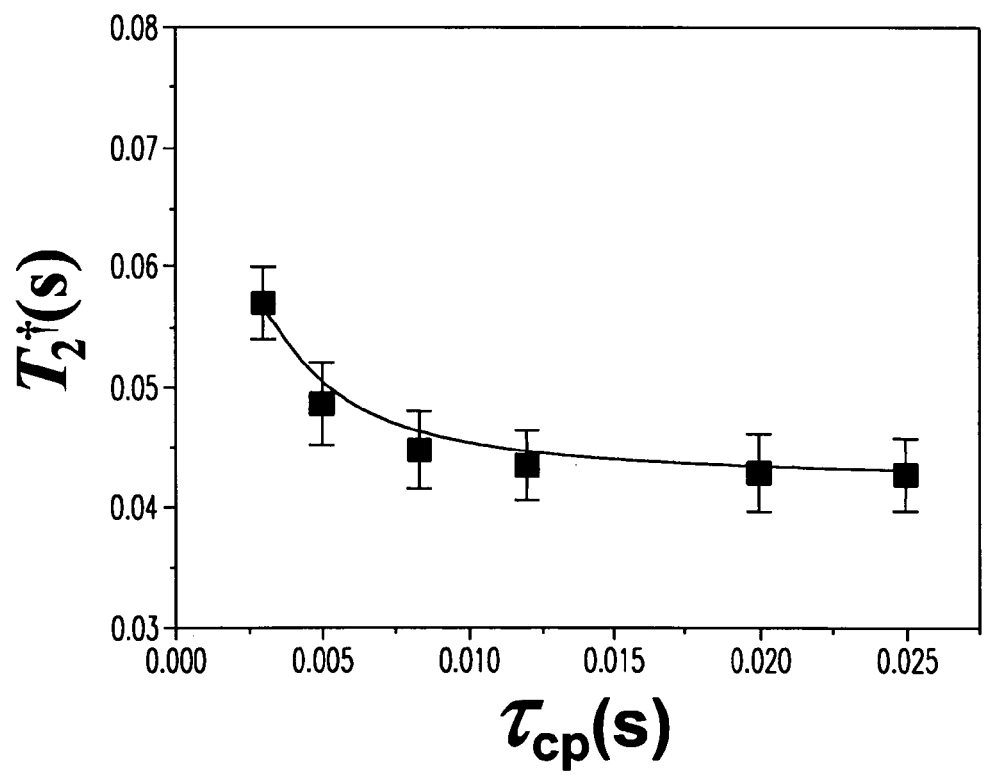

$T_2^\dagger$ measurements as a function of $\tau_{cp}$ in the CP pulse sequence was performed at 4T and 7T as illustrated in FIGS. 4A and 4B. For these measurements, the $CP^{HS1}$ pulse sequence was used. FIGS. 4A and 4B show plots of the $T_2^\dagger$ values (MEAN±SD) obtained in these measurements. The $T_2^\dagger$ values measured at 7T were smaller than those at 4T (p<0.01, two-tailed). $T_2^\dagger$ dependence on $\tau_{cp}$ was observed with $\tau_{cp}<12$ ms. With longer $\tau_{cp}$ values, the $T_2^\dagger$ time constants were independent of $\tau_{cp}$ (no significant difference, p>0.704).

In particular, FIG. 4A illustrates averaged calculated $T_2^\dagger$ time constants at 4T (for 6 individuals) and FIG. 4B illustrates results at 7T (for 5 individuals) as a function of $\tau_{cp}$ and the superimposed simulations (solid line) based on Eqs. 10, 11, 13. Errors represent standard deviations.

Fitting of the experimental data measured in human brain at 4T and 7T using Eqs. 10 and 13 yielded: $\delta\omega(7T)/\delta\omega(4T) \approx 1.07$. However, linear increase of $\delta\omega$ with magnetic field strength (a factor of 1.75 here) is required by the anisochronous DA model (Eq. 10). Therefore, this result indicates that, in addition to anisochronous DA, other mechanisms contribute to transverse relaxation of brain $^1H_2O$ and these should be considered during the adiabatic CP pulse sequence. A likely possibility is the dipolar interaction mechanism. Thus, assume that $R_{2,dd}=R_2^0$. Fitting to the experimental data was obtained using $R_{2\rho,dd}=6.0\pm0.4$ s$^{-1}$, with Eqs. 10, 11, 13 and the ratio $\delta\omega(7T)/\delta\omega(4T)=1.59\pm0.25$ (FIGS. 4A and 4B). Other parameters obtained from the fitting were: $\tau_{ex}=1.05\pm0.15$ ms, and $P^A P_B(\delta\omega)^2=(12.0\pm0.75)\times10^3 (rad/s)^2$ at 4T. For the dipolar interaction between identical spins, $R_{2\rho,dd}\approx6.0$ s$^{-1}$ corresponds to the correlation time $\tau_c\approx1.1\times10^{-10}$ s. Calculations performed using Eq. 6 (using r=1.58 Å for water) show that, for this correlation time, $R_{2\rho,dd}$ should be essentially independent of $\omega_0$ between 170 and 300 MHz. Moreover, it can be seen that, using Eqs. 6 and 9 and $\tau_c=1.1\times10^{-10}$ s, the dependence of $R_{2\rho,dd}$ on the AFP modulation functions is small. Thus, it was assumed that, both at 4T and 7T, the same apparent dipolar relaxation rate constant contributes to the $CP^{HS1}$ and $CP^{HS4}$ measurements. Water in the brain is characterized by different $\tau_c$ values corresponding to different water environments, such as hydrated myelin sheet, cytoplasm or CSF. Although $T_{2\rho}$ contrast in brain $^1H_2O$ is expected to be sensitive to large water correlation times $\tau_c>10^{-9}$ s, such a contribution was found to be insignificant.

In one example, the same parameters obtained from the measurements of $T_2^\dagger$ dependence on $\tau_{cp}$ in the adiabatic CP pulse sequence at 4T and 7T were used for the simulation of the $T_{2\rho}$ measurements performed with $CP^{HS1}$ versus $CP^{HS4}$ pulse sequences. Taking into account contributions due to dipolar relaxations (Eq. 9), agreement was noted between theory and the $T_{2\rho}$ measurements with the $CP^{HS1}$ and $CP^{HS4}$ pulse sequences. A ratio of $T_{2\rho}(CP^{HS4})/T_{2\rho}(CP^{HS1})\approx1.18$ was obtained.

The observed increase of the $T_{2\rho}(CP^{HS4})$ versus $T_{2\rho}(CP^{HS1})$ cannot be attributed to conventional magnetization transfer (MT), because MT generally causes a reduction in image SI in tissue, which is contrary to the changes noted. Although a small contribution from a positive Nuclear Overhauser Effect (NOE) associated with the fast motional regime can lead to an increase in the SI, it cannot be completely ruled out.

The isochoronous CE mechanism between spins at different sites A and B with $\delta\omega=0$ and $T_{2A}\neq T_{2B}$ can also lead to a change of the $T_2^\dagger$ time constants through changes in the apparent populations of the sites A and B and the time constants $T_{2A}$ and $T_{2B}$ (Eq. 8). The experimental results and theoretical analysis suggested that $T_{2\rho}$ contrast generated by HS1 and HS4 pulses is sensitive to the DA in the human brain.

Thus, it appears that adiabatic pulses with different modulation functions can be exploited to directly assess $T_{2\rho}$ relaxation and to generate tissue contrast in the human brain. Analysis of the $T_2^\dagger$ time constants measured using adiabatic CP pulse sequences can take into account both $T_{2\rho}$ relaxation during the adiabatic pulses and the relaxation due to the free precession during the interpulse time intervals. Modeling based on the anisochronous DA mechanism (in the FXL) alone leads to an impossible dependence of $\delta\omega$ on magnetic field. One or more other relaxation channels must therefore contribute to transverse relaxation during an adiabatic CP pulse sequence. A probable contribution appears to be relaxation due to dipolar interactions. For dipolar relaxation between identical spins, the dependence of the $T_{2\rho}$ time constants on the modulation functions of the AFP pulses was found to be insignificant. Thus, DA is the major mechanism in the brain tissue contributing to the $T_{2\rho}$ dependence on the modulation functions of AFP pulses.

In addition to $T_{2\rho}$ relaxation, $T_{1\rho}$ contrast can also be generated by adiabatic HSn pulses in human brain at, for example, a field of 4T. In particular, the present subject matter considers dipolar cross-correlations mechanism in tissue.

For example, during a train of adiabatic full passage (AFP) pulses of the HSn family placed prior to the excitation by the adiabatic half passage (AHP) pulse, magnetization follows the time-dependent effective magnetic field $\omega_{\it eff}(t)$ during the AFP pulses. When the time between pulses is zero (or approximately zero), magnetization decay during the pulse train is governed mainly by time-dependent longitudinal relaxation in the tilted double rotating frame, $T_{1\rho}$. $T_{1\rho}$ relaxation is significantly dependent on the choice of adiabatic pulses with different modulation functions. Accordingly, the present subject matter allows for $T_{1\rho}$ relaxation contrast of $^1H_2O$ in the human brain and measurement of relaxation parameters of the dipolar relaxation pathways.

The transverse relaxation in the rotating frame ($T_{2\rho}$) is the dominant relaxation mechanism during an adiabatic Carr-Purcell (CP) spin-echo pulse sequence with no delays between refocusing pulses. Exchange-induced $T_{2\rho}(T_{2\rho,ex})$ and the $T_{2\rho}$ due to dipolar interactions ($T_{2\rho,dd}$) was found to depend on the modulation functions of the adiabatic pulses used. This property of adiabatic pulses can be used to generate the $T_{2\rho}$ contrast in the human occipital lobe $^1H_2O$ at 4T magnetic field. It was shown that dynamic averaging (DA), e.g. chemical exchange and diffusion in the locally different magnetic susceptibilities, is the major mechanism contributing to the $T_{2\rho}$ dependence on the modulation functions of the adiabatic full passage (AFP) pulses of the HSn (n=1,4) family in brain tissue.

Consider next the adiabatic $T_{1\rho}$ contrast generated by an adiabatic train of HS1 and HS4 pulses placed prior to the excitation by the adiabatic half passage (AHP) pulse with no time intervals between pulses. Adiabatic $T_{1\rho}$ contrast originates from dipolar cross-correlations (e.g., interference between dipolar relaxation pathways), and the DA mechanism has just a minor contribution to the $R_{1\rho}$ relaxation rate constants in the human brain tissue. Adiabatic $T_{1\rho}$ contrast provides a possibility to directly assess dipolar type of interactions (i.e., cross-correlations) in living tissue. In general, adiabatic pulses exhibit $B_1$ insensitivity.

NMR relaxation in tissue is subject to complex mechanisms including chemical exchange and magnetic interactions between different molecular constituents in several tissue compartments. A two-site model that represent extracellular (as well as interstitial) and intrasellular water reservoirs, respectively, was studied. These two reservoirs are coupled by the two-site exchange (2SX) mechanism that represents water diffusion through cell membranes.

In one example, three issues are considered: 1) orientational order of $^1H$ dipolar interactions and its contribution to the relaxation dispersion; 2) the effect of cross-correlations between water protons and the macromolecules associated protons; 3) 2SX between two water reservoirs and CE between labile protons (associated with macromolecules) and water.

Figure 5A:
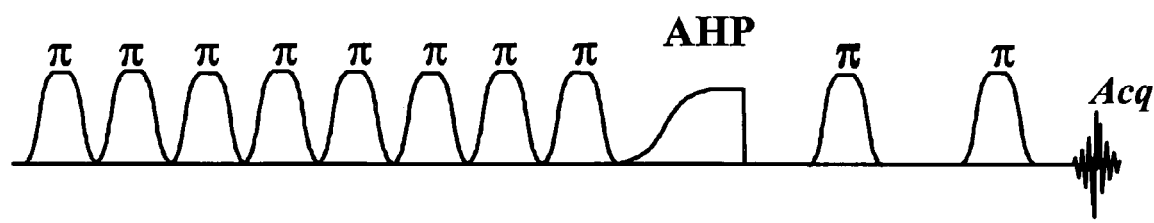
FIGS. 5A-5F illustrate a schematic representation of the adiabatic pulse sequence used for adiabatic $T_{1\rho}$ measurements and image results.
Figure 5B:
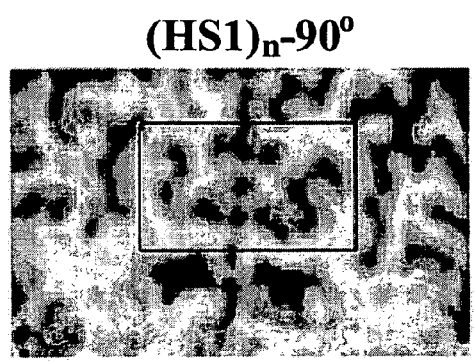
Figure 5C:
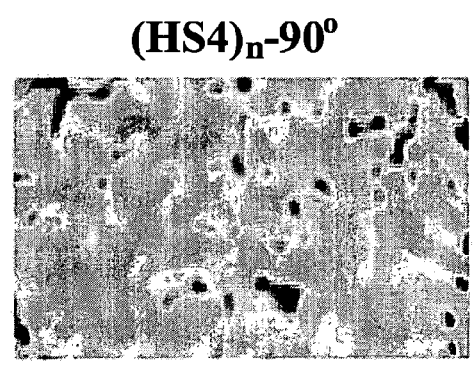
Figure 5D:
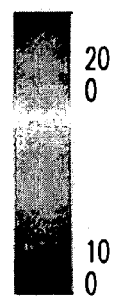

FIG. 5A illustrates a schematic representation of the adiabatic pulse sequence used for $T_{1\rho}$ measurements and scaling for the results appears in FIG. 5D.

In FIGS. 5B and 5C the $T_{1\rho}$ maps generated from the measurements using $(HS1)_n$–90° pulse (FIG. 5B) and $(HS4)_n$ –90° pulse (FIG. 5C) are presented. As illustrated, $T_{1\rho}$ relaxation is significantly affected by the modulation functions of the adiabatic pulse used and the ratio $T_{1\rho}$ $((HS1)_n -90°)/T_{1\rho}((HS1)_n,-90°) \approx 1.51 \pm 0.15$ was obtained (5 individuals). The contribution of the anisochronous $T_{1\rho,ex}$ (e.g., CE between spins with different chemical shifts dw≠0) during the HS1 and HS4 pulses was estimated using the aforementioned relaxation equations and the parameters obtained from the 4T human relaxation data. This analysis yields an exchange-induced relaxation rate constants that are smaller as compared to dipolar relaxation rate constants for the rotating frame longitudinal relaxation. This implies that dipolar relaxation dominates under these experimental conditions ($\omega_1^{max}$=2.5 kHz, pulse length Tp=3 ms). In this work the formalism for the three-spin system dipolar relaxations $T_{1\rho,dd}$ was implemented for the HS1 (FIG. 5B) and HS4 (FIG. 5C) pulses, respectively. The dependences of the $R_{1\rho,dd}$ on the rotational correlation times $\tau_c$ during the HS1 and HS4 pulse are presented on FIG. 6.

Figure 5E:
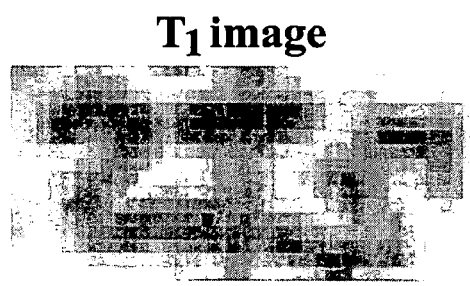
Figure 5F:
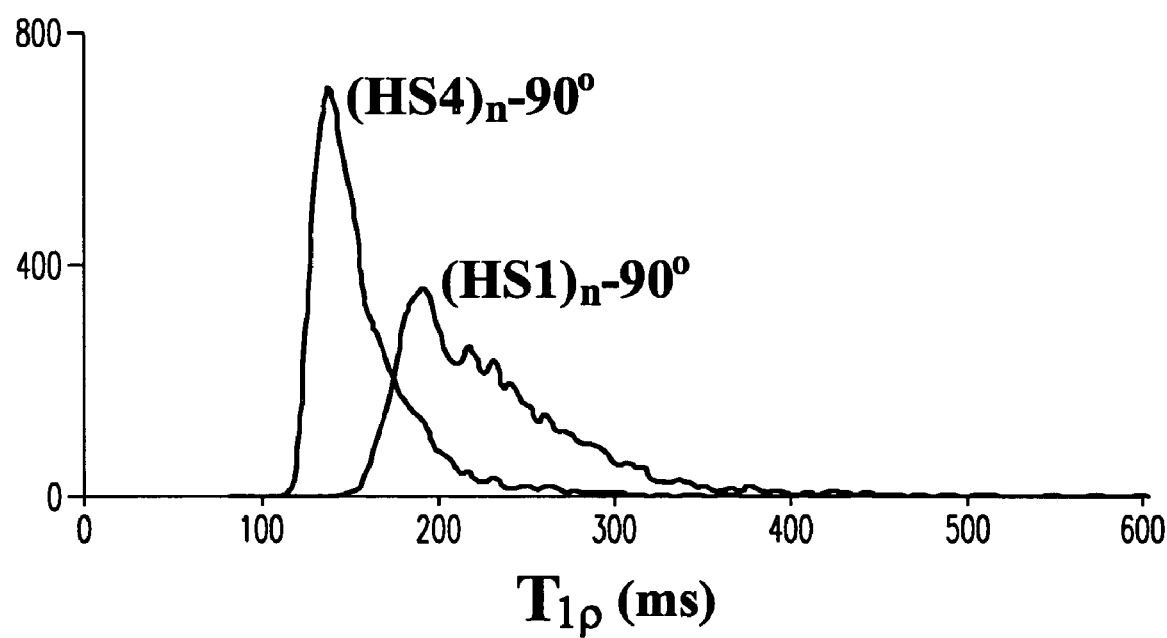

FIG. 5E illustrates the region of interest (ROI) of the $T_1$ weighted image and FIG. 5F illustrates $T_{1\rho}$ relaxograms of a human brain image slice in the occipital lobe, generated from the $T_{1\rho}$ maps.

Figure 6A:
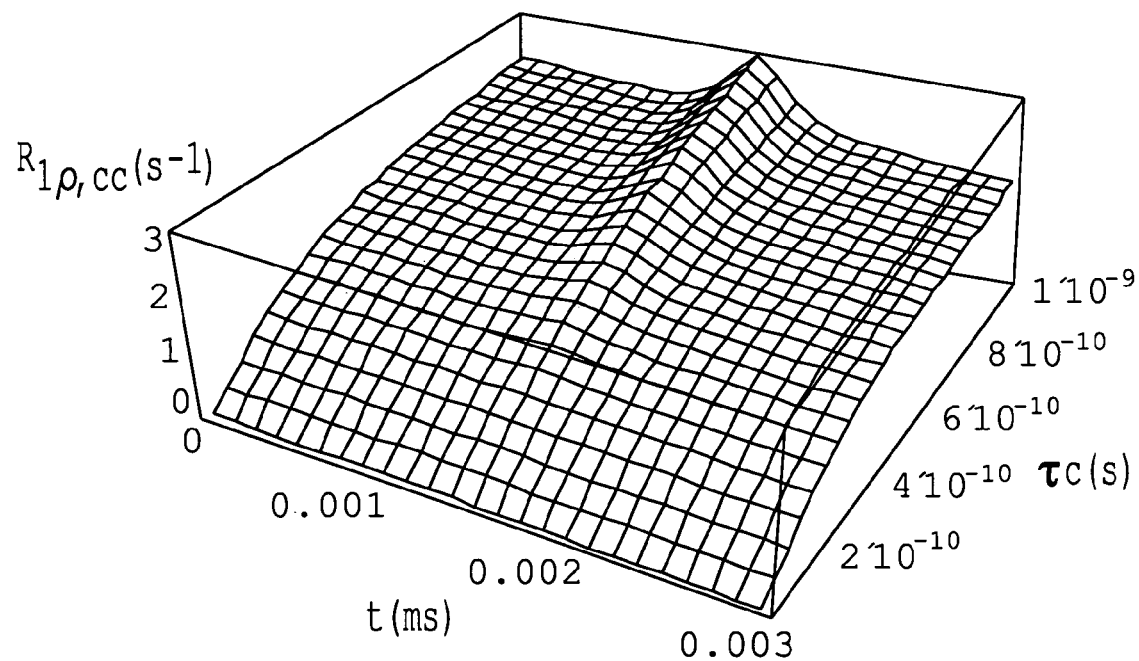
FIGS. 6A and 6B illustrate calculated longitudinal relaxation rate constants during different pulses as a function of the rotational correlation time ($\tau_c$).
Figure 6B:
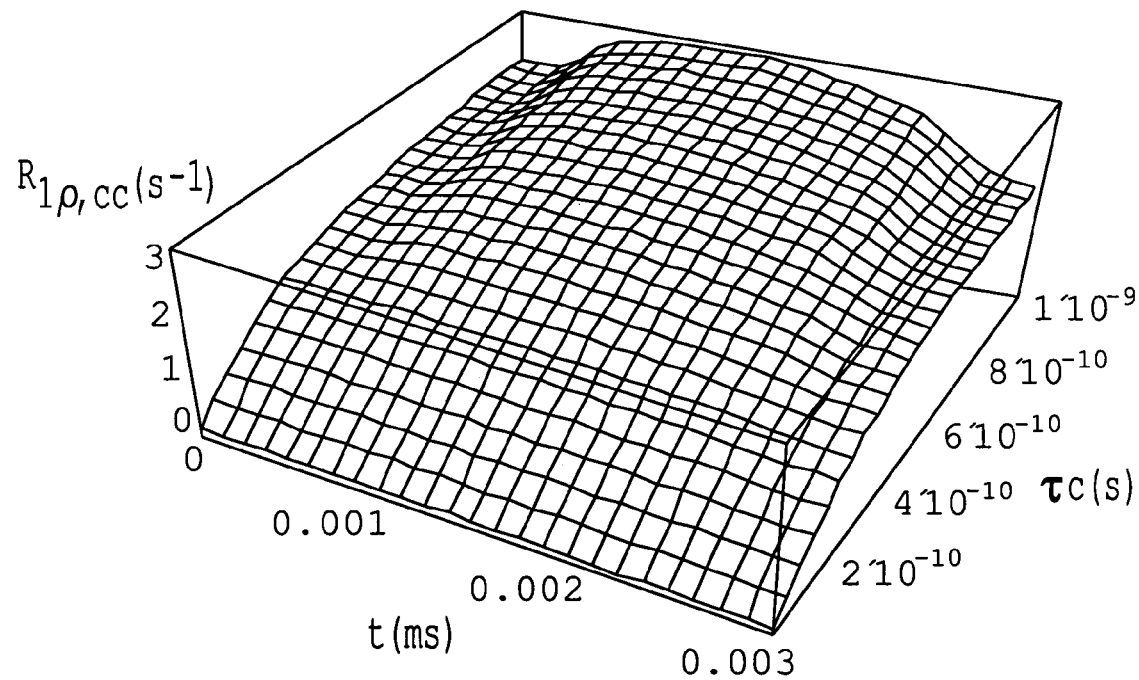

FIGS. 6A and 6B illustrate calculated longitudinal relaxation rate constants ($R_{1\rho}$) during the HS1 pulses (6A) and $HS_4$ pulses (6B) as a function of the rotational correlation time ($\tau_c$). The pulse parameters used for calculation were: pulse length Tp=0.003s, R=20, $\omega_1$=2.5 kHz.

Figure 7A:
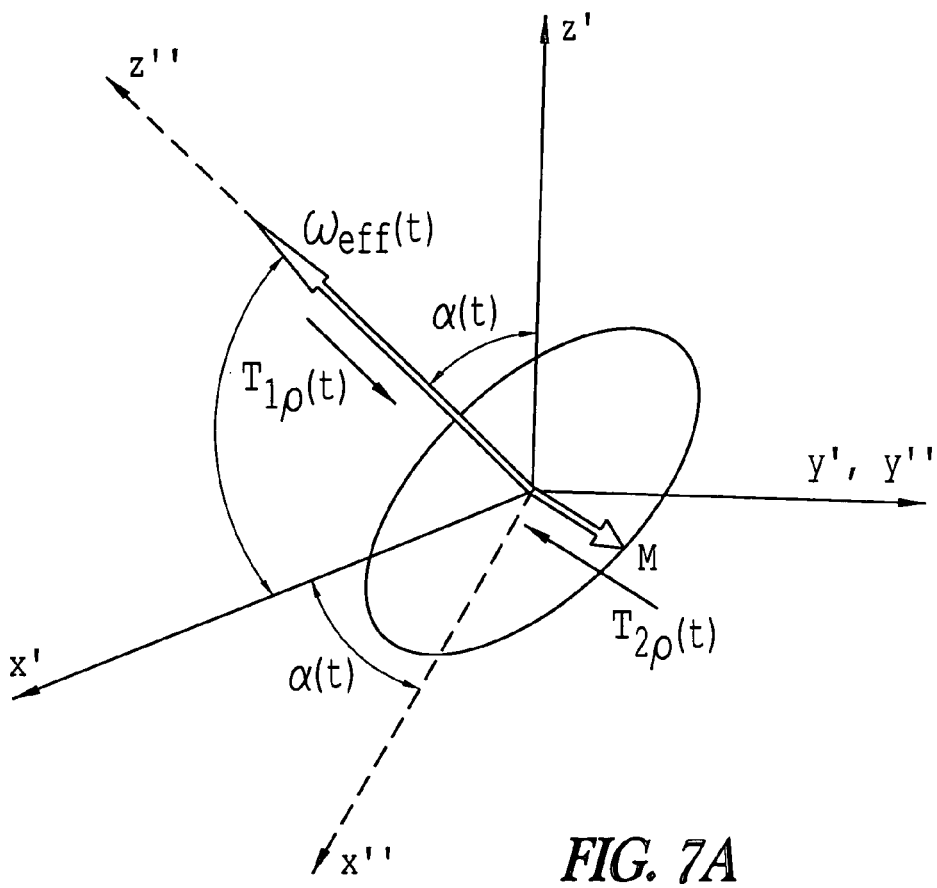
FIGS. 7A and 7B illustrate the rotating frame of reference.
Figure 7B:
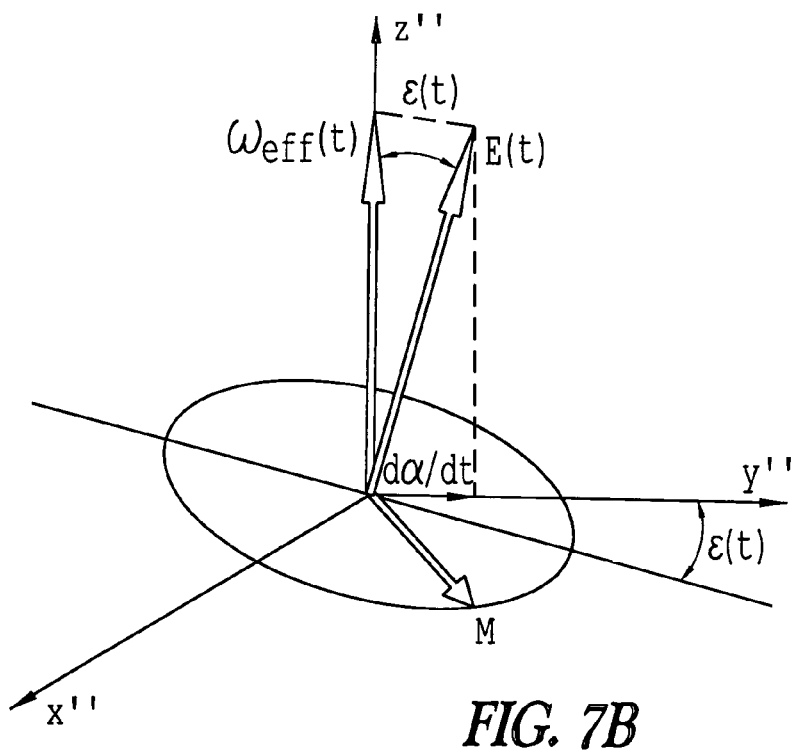

FIGS. 7A and 7B illustrate the rotating frame of reference. In particular, FIG. 7A illustrates the effect of an adiabatic full-passage on a magnetization vector initially in the transverse plane, as viewed from the frequency modulated reference frame denoted by x', y' and z'. During adiabatic rotation, the magnetization vector M remains approximately perpendicular to $\omega_{\it eff}(t)$. The figure also illustrates the orientation of the tilted double rotating frame (TDRF), denoted by x", y" and z", relative to the frequency modulated frame. Any component of M that is aligned with $\omega_{\it eff}(t)$ will relax with time constant $T_{1\rho}(t)$ along the z" axis whereas the component perpendicular to $\omega_{\it eff}(t)$ will relax with the time constant $T_{2\rho}(t)$ in the x"-y" plane. FIG. 7B illustrates a vector diagram showing the effective field E(t) and its components in the TDRF. Vector M evolves around E(t) in a plane tilted by the angle $\epsilon(t)$ relative to the x"-y" plane. When the adiabatic condition is satisfied, $|\omega_{\it eff}(t)|>>|d\alpha/dt|$, the field component $d\alpha/dt$ can be neglected and vector M revolves around $\omega_{\it eff}(t)$.

Figure 8A:
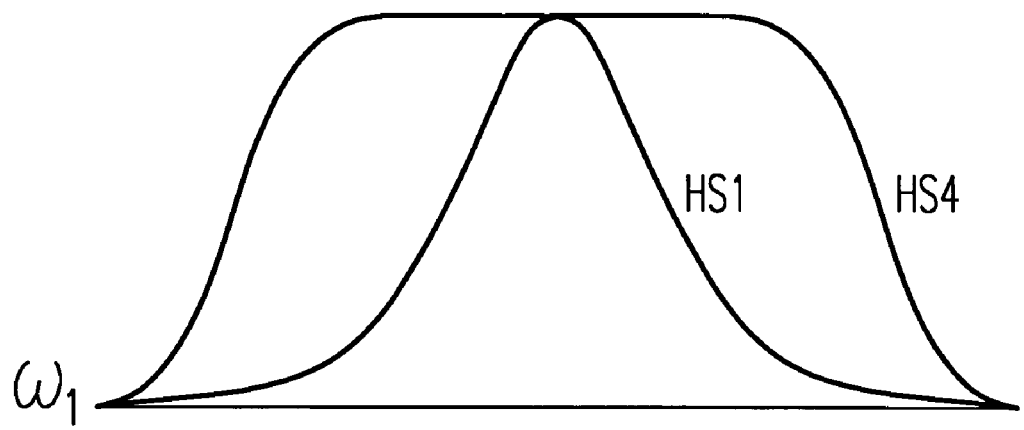
FIGS. 8A and 8B illustrate exemplary pulse modulation functions.
Figure 8B:
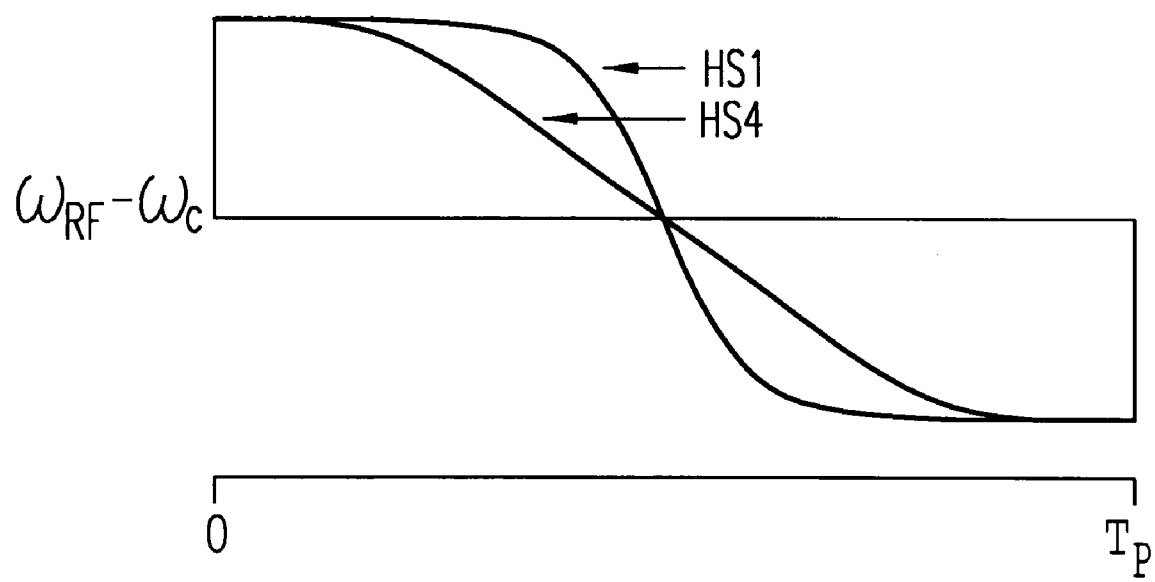

FIGS. 8A and 8B illustrate amplitude (8A) and frequency (8B) modulation functions in the frequency modulated frame for two different adiabatic full passage pulses, namely HS1 and HS4.

Figure 9:
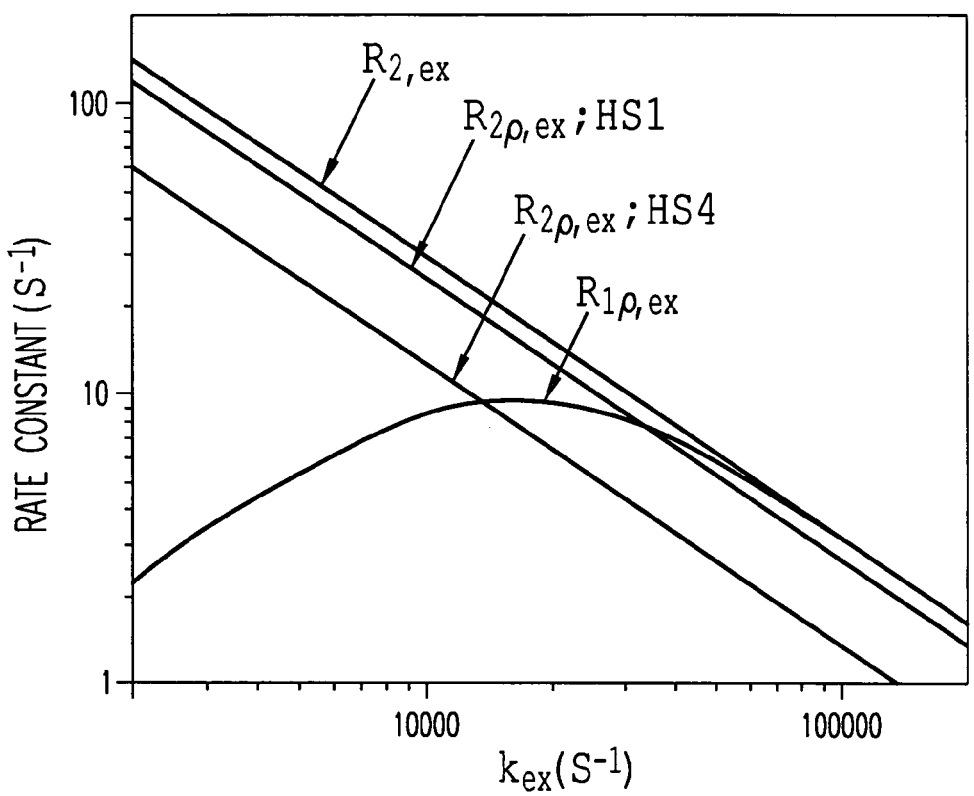
FIG. 9 illustrates theoretical comparison between selected relaxation mechanisms during adiabatic pulses.

FIG. 9 illustrates theoretical comparison between relaxation $R_{2,ex}$, $R_{2\rho,ex}$ $R_{1\rho,ex}$ during adiabatic pulses HS1 and HS4 based on $\omega_1^{max}/2\pi=2.5$ kHz, $\delta\omega=0.85$ ppm and $P_A P_B=0.247$.

Adiabatic $T_{1\rho}$ contrast based on the difference in the modulation functions of the adiabatic pulses, was generated in the human brain. This relaxation contrast provide a direct assessment of the dipolar relaxations in tissue. Adiabatic $T_{1\rho}$ contrast may facilitate investigation, characterization and diagnosis of neurodegenerative disorders, cancer and stroke.

Figure 10:
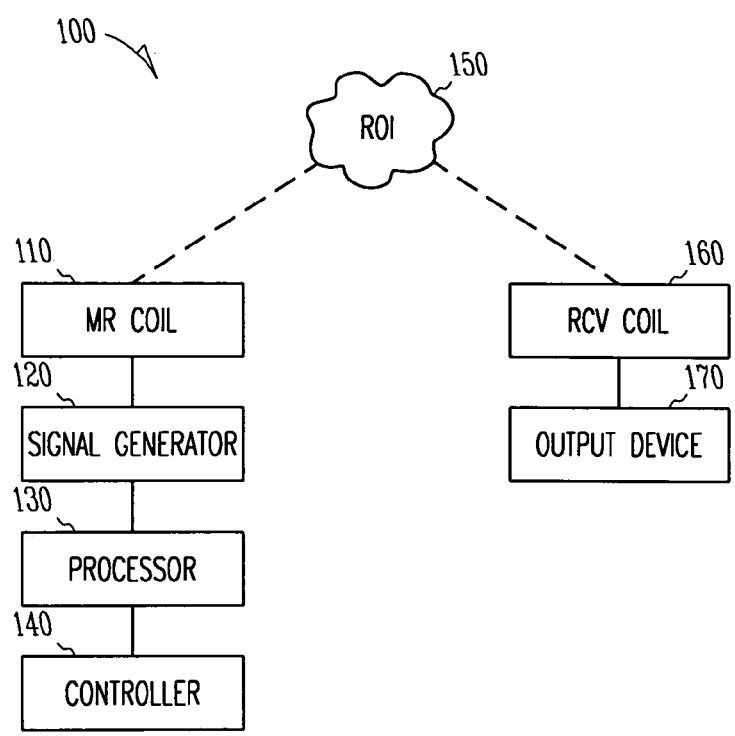
FIG. 10 includes a block diagram of an exemplary magnetic resonance system.

FIG. 10 illustrates a block diagram of exemplary magnetic resonance system 100. System 100 includes signal generator 120 coupled to processor 130. The signal generator provides radio frequency pulses to magnetic resonance transmitter coil 110 within magnetic resonance system 100. Processor 130 executes instructions that controls the operation of signal generator 120. In one example, the instructions are tailored to form a sequence including a pulse train and an excitation pulse. The pulse train, in one example, includes a plurality of pulses, at least one pulse of which satisfies the adiabatic condition. The sequence is configured to generate a magnetic resonance signal that decays by relaxing in a rotating frame of reference. Adiabatic pulses in the pulse train are characterized by different modulation functions, e.g. are modulated in amplitude or waveform (phase and frequency). For example, an interpulse interval between adjacent pulses can be substantially zero or non-zero. The order of the adiabatic pulse train and the excitation pulse can be tailored for a particular purpose, including for example, analysis of $T_{1\rho}$ or $T_{2\rho}$ relaxation. In one example, at least one slice selection pulse is applied to the region of interest. In one example, controller 140 is coupled to processor 130 and controller 140 is configured to receive a user selection. For example, controller 140 can include a keyboard, a touch-screen, a mouse or other user-operable control device and the sequence is configured based on an input received by controller 140. For instance, a selection received by controller 140 is used to select a modulation function for the sequence or a relaxation parameter. In one example, system 100 includes receiving coil 160 coupled to output device 170. Output device 170 can include, for example, a display, a printer, a storage device, or other component to generate or display data based on the magnetic resonance signal. Transmit coil 110 and receive coil 160 are disposed proximate to region of interest 150.

Figure 11:
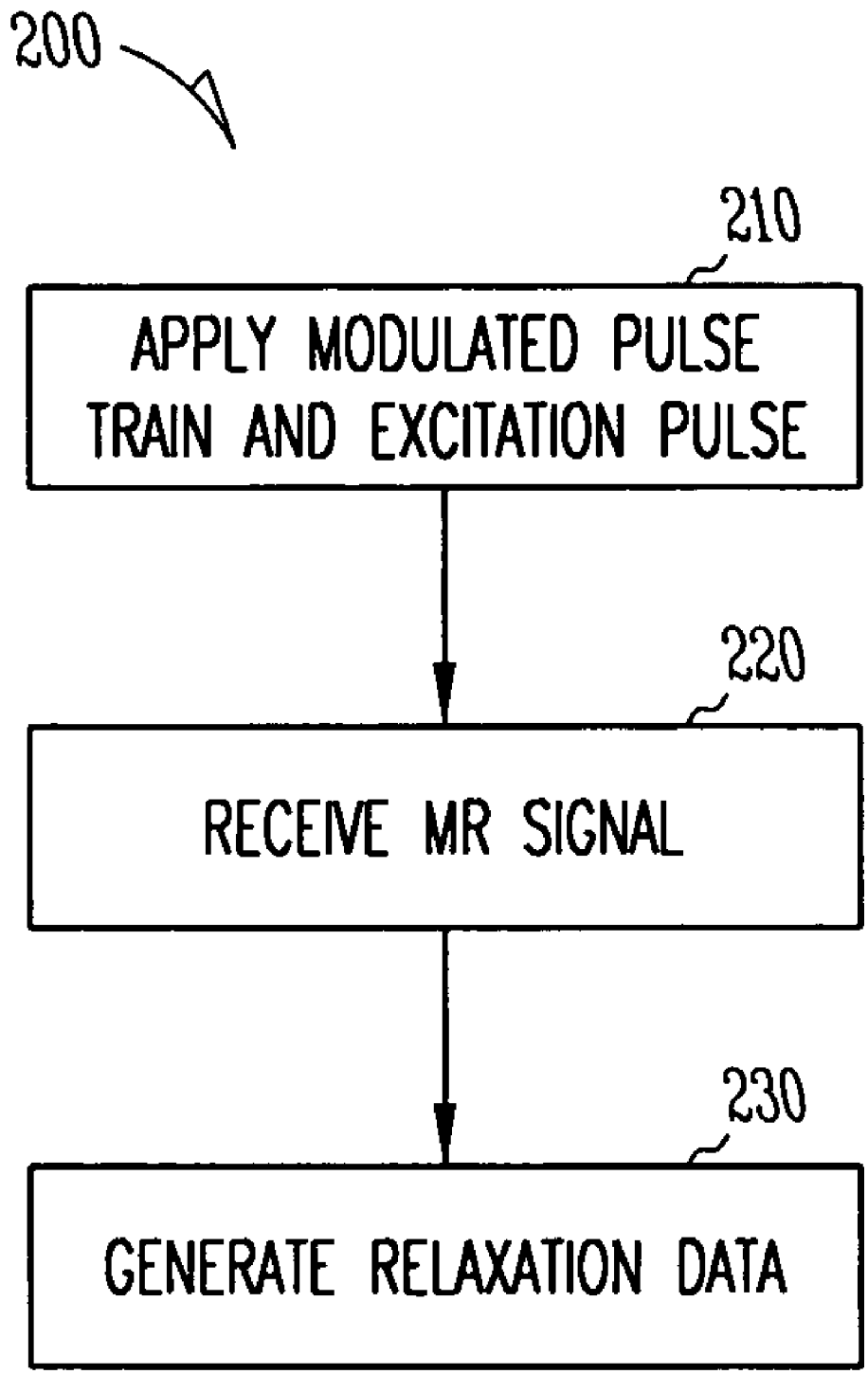
FIG. 11 illustrates an exemplary method according to the present subject matter.

FIG. 11 illustrates an exemplary method according to the present subject matter. In the figure, method 200 includes sequentially applying a pulse train and an excitation pulse (at 210) and generating data based on a magnetic resonance signal received (at 220) from a region of interest and wherein the data corresponds to relaxation (at 230) in a rotating frame of reference. The pulse train and the excitation pulse are applied to the region of interest in a static magnetic field. The pulse train includes a plurality of pulses, each having duration and a waveform and wherein the waveform is configured to modulate an effective field vector and wherein the relaxation is based on the waveform. Different pulses of the plurality of pulses can differ in terms of the pulse duration or waveform. A second pulse train can be applied wherein the second pulse train is modulated in a manner different than the first pulse train and the relaxation is determined based on the different magnetic resonance signals received. The pulse train includes an adiabatic full passage pulse and the excitation pulse can include an adiabatic half passage pulse. The order of the pulse train and the excitation pulse can be selected to analyze a different relaxation parameter. Slice selection pulses can be applied before, during or after the pulse train and the excitation pulse. Data can be received simultaneously with application of the slice selection pulse. The resulting data can include a visual image, spectroscopy data or both.

In one example, a method includes applying a pulse sequence (including an adiabatic pulse train and an excitation pulse) to a specimen, receiving a magnetic resonant image from the specimen and determining relaxation based on the signal. As noted elsewhere in this document, the order of the pulse train and the excitation pulse are tailored for a particular relaxation. A number of relaxation mechanisms can be studied with the present subject matter and one example includes selecting one or more mechanisms from a plurality of mechanisms and the sequence is tailored based on the selected mechanism. The sequence can be configured in terms of pulse order, modulation function, pulse duration and power level (amplitude). In one example, the adiabatic pulse train includes a plurality of adiabatic full passage pulses and the excitation pulse includes an adiabatic half passage pulse.

The term contrast denotes a difference. In the context of magnetic resonance spectroscopy, contrast refers to a perceivable difference in properties that makes a feature of an image distinguishable from other features, including, for example, a background. By way of example, in a stroke patient, contrast between carotid arteries and plaque allows detection, identification and determination of progression of disease formation.

In one example, relaxation is measured during an adiabatic pulse with time-dependent RF radiation. The RF radiation is modulated to generate different functions. Relaxation mechanism can be selectively assessed based on the design of the pulse sequence applied. For example, the pulse train can be followed by an excitation pulse for analysis of $T_{1\rho}$ and the order reversed for analysis of $T_{2\rho}$ relaxation. Furthermore, the RF radiation can be tailored, in terms of the amplitude and waveform (phase and frequency) to achieve different purposes. In particular, the different relaxation mechanisms can be discerned by suitable modulation and tailoring of the pulse sequence using adiabatic pulses as well as non-adiabatic pulses. In one example, relaxation is measured during an adiabatic full passage pulse train.

In one example, data regarding isochronous exchange, or dipole-dipole interaction, is generated based on $T_{1\rho}$ as function of time. In one example, data regarding anisochronous exchange is generated based on $T_{2\rho}$ as function of time. In one example, anisochronous exchange correlates to a difference in pH.

In one example, the sequence includes applying an adiabatic pulse at a radio frequency and aligned on an axis different than that of the static magnetic field. Magnetic resonance data corresponding to relaxation time is generated based on a signal received by a receiving coil. In one example, the relaxation time is viewed in frame of reference rotating in a plane lying substantially perpendicular to the first axis. Contrast can be generated based on difference data corresponding to a first and second pulse sequence. The pulse sequences can be modulated in amplitude and frequency. In one example, a delay period between adjacent pulses of the pulse sequence is configured to produce a desired result. Relaxation time can be determined in a rotating frame that is aligned transversely or longitudinally.

Alternative Examples

Other examples, in addition to those specifically described above, are also contemplated. For example, one or more radio frequency pulses of the pulse train can be modulated to yield a particular relaxation rate constant. For instance, the duration or amplitude of the waveform of individual pulses in the pulse train can be modulated to obtain a particular relaxation. By modulating the amplitude, frequency and phase of the pulse train, the observable relaxation rate in the rotating frame of reference can be modulated.

In one example, one or more pulses of the pulse train satisfy the adiabatic condition sometimes expressed as $|\omega_{eff}(t)| >> |d\alpha/dt|$. In one example, one or more pulses of the pulse train are non-adiabatic pulses.

In one example, the train has no interpulse interval between adjacent pulses. In one example, a brief interpulse interval separates adjacent pulses of the pulse train.

In one example, multiple runs are executed for a particular specimen in a region of interest with each run including a particular pulse train and excitation pulse. The pulses of the different pulse trains can include frequency modulated, amplitude modulated or phase modulated pulses configured for a particular relaxation with each train having different modulation or each pulse within a train having different modulation.

One example of the present subject matter includes a method for generating a contrast for magnetic resonance spectroscopy ($T_{2\rho}$ and $T_{1\rho}$) based on modulating a function that defines the shapes of the pulses in a pulse train. The shapes (trajectory) of the pulses are tailored or modulated to increase persistence of a received signal and to enhance sensitivity.

In one example, the pulse train includes adiabatic pulses or other pulses that sweep as a function of time. By modulating the pulse, the present subject matter allows modulating of the contribution arising from exchange and dipole-dipole interaction. The pulse can be modulated in terms of the amplitude of the radio frequency and the frequency (phase). In addition, a time delay or interval can be adjusted.

For example, in a sample of ethanol and water (an OH group), the chemical exchange is fast (the system is in the fast exchange regime) and a spectrum reveals a single resonance at the frequency of water. By changing the adiabatic pulse modulation the relaxation rate constant can be modulated. Relaxation rate constants measured at different pH levels were measured with the different pulses of the hyperbolic secant (HSn) family and described well by the theory that was derived.

The pulse sequence can be modulated by changing the number of pulses (increasing or decreasing), changing a delay time period (insert, remove or adjust a time period) and changing the pulse modulation function (amplitude, frequency or phase).

The underlying processes for $T_1$ and $T_2$ differ. One factor contributing to $T_1$ is dipole-dipole interactions. The nucleus of a water molecule has a magnetic dipole which can convey energy to other molecules (each also having magnetic dipoles) that are tumbling at particular frequencies in the RF range. Dipole-dipole interactions are similar to transitions in energy levels. After exposing the sample to RF excitation, the magnetic dipoles of the particular water molecule and the neighboring dipoles tumble and release energy as they resume alignment with the magnetic field.

The $T_2$ process occurs by dipole-dipole interactions and by other mechanisms, including dynamic averaging. Dynamic averaging includes chemical exchange and diffusion. Chemical exchange refers to the exchange of protons in a water molecule with protons in other nearby water molecules. For example, water molecule has hydrogen atoms that are chemically exchanging with other hydrogens, such as hydroxel groups on on DNA, macromolecules, enzymes, membranes, or other large molecules. Dynamic averaging leads to a dephasing. The magnetic susceptibility of a tumor, a blood vessel and brain tissue all give rise to different local magnetic field variations. The spins in the different tissue will precess at different frequencies based on the local field strength within the tissue. Thus, the magnetic resonance relaxation parameters will be different. Other lesser factors in addition to dynamic averaging, such as dipolar relaxation pathways, also contribute to $T_2$ relaxation. The cross relaxations and the relaxations due to chemical shift anisotropy are believed to be less significant than the auto (self)-relaxations and the dynamic averaging.

In one example, a magnetic resonance image is generated by acquiring a signal following excitation. For example, an excitation pulse is applied and after some time delay (called the echo time or TE), the signal is acquired. In the case of a 180 degree excitation pulse, the acquired signal is referred to as a spin echo.

During the time delay, chemical exchange, diffusion and other process will have caused the signal to decay. If detected early, the signal will have a greater magnitude and after a delay, the signal intensity will be lower.

The amount of signal decay depends on the environment of the water molecule as well as the types of macro molecules or type of membranes. For example, in cancers, the process of signal decay is catalyzed by pH. Cancers have a relatively acidic extracellular pH.

Both relaxation times $T_1$ and $T_2$ are a function of the chemical exchange process. In addition, time $T_1$ is also a function of dipole-dipole interaction.

In the present subject matter, the signal is received in conjunction with the application of a continuous series of excitation pulses. It is believed that continuous application of pulses can suppress certain contribution and thus, avoid decay of the signal.

To achieve this result, the excitation pulses are modulated in a particular manner. In one example, the frequency of the pulses are modulated and can be described as adiabatic full passage.

In one example, decay can be suppressed completely or suppressed to a selected degree based on the modulation of the excitation pulses. For instance, two images can be acquired using different pulse trains, with each train having different pulse shapes, frequency or modulation. A difference image based on the different pulse trains can reveal the contribution from, for example, chemical exchange only.

In one example, the present subject matter allows separation of the two contributions (chemical exchange and dipole-dipole interaction) in a $T_2$ image.

In one example, the contrast can be made specific to a particular pH and thus allow imaging or spectroscopy of, for example, a tumor having an acidic extracellular pH.

The present subject matter reduces the masking effect of the chemical exchange process caused by dipole-dipole interaction, thus allowing an image based on different pH values. For example, a disease or condition that produces a change in the dipole-dipole interaction in one direction can be obscured by a chemical exchange in the opposite direction.

At high magnetic field strength, the magnetic resonance image is dominated by the exchange contribution. The difference in resonance frequency (when the hydrogen is in different positions) changes linearly with the magnetic field. With a larger chemical shift difference, the dephasing process occurs more rapidly, thus yielding a bigger difference in frequency. Chemical exchange is a more dominating effect as magnetic field strength rises. For example, at a magnetic field of 4T chemical exchange is dominant. As to dipole-dipole interaction, there is little dependence on magnetic field strength. At lower fields, the relative magnitude of dipole-dipole interaction is comparable to that of chemical exchange.

In addition to generating changes in the exchange contribution, selection of the pulse train shape can also generate changes in the dipole-dipole contribution.

The pulse train shape can be selected to modulate the contribution to relaxation arising from chemical exchange and to modulate the contribution to relaxation arising from dipole-dipole interaction.

In one example, the radio frequency excitation pulse can be selected to keep the chemical exchange process focused and thus prevent dephasing of the magnetization.

The term $T_{2\rho}$ corresponds to a radio frequency pulse applied in the rotating frame and at the same frequency as the spins precess. Magnetization dephases (phase coherence is lost) because of the exchange process, dipole-dipole interaction and B1 inhomogeneity. The inability to, for example, provide a perfectly homogenous RF field causes the rate at which the spins evolve to vary and since the effective B1 field is varying, then phase coherence will also vary.

The present subject matter includes a particular sort of pulse sequence to achieve $T_{2\rho}$ contrast. The shapes of the pulses are changed to modulate the contrast.

In one example, a continuous RF pulse train or sequence (with one pulse following another) and having a frequency dependence (including, for example, those having frequency swept pulses, or adiabatic full passage). In an adiabatic full passage pulse, the frequency of the RF sweeps from one side of resonance to the other side of resonance.

The present subject matter allows for extended excitation of the sample and thus permits gathering of more information (improved signal to noise ratio) and faster image generation. The time dependence of the effective field sweep determines the relaxation rate constants caused by the different relaxation mechanisms.

The rate constant for laboratory frame longitudinal relaxation ($R_1$) is particularly sensitive to the molecular fluctuations of magnetic dipolar interactions, but only those at high frequencies near that ($\omega_0$) of the Larmor precession (i.e., in the MHz range). It is believed that dipolar fluctuations in tissue occur at lower frequencies (i.e., in the kHz range). The rotating frame longitudinal relaxation rate constant ($R_{1\rho}$) is driven principally by dipolar fluctuations at frequencies near that ($\omega_{eff}$) of the effective Larmor precession in the simultaneous presence of the RF and laboratory magnetic fields. Since this can be "tuned" by adjustment of $\omega_1$, the (Rabi) frequency measure of the RF amplitude, it is believed that this can provide experimental access to the relevant lower frequencies by modulating the pulse train, the present subject matter allows selection of the molecular motions that contribute to relaxation. For example, the motions occurring between water and large molecules instead of water and intermediate size molecules can be isolated since larger molecules tumble more slowly. In other words, the dipole-dipole relaxation contribution for MR contrast can be modulated based on the pulse train modulation function selected.

In one example, a difference image is generated by subtracting images acquired by different modulation functions and normalizing.

For example, two images are acquired using adiabatic full passage pulse trains based on HS4 and HS1. The difference of these two images is then normalized by one of the images to generate a difference image which exhibits contrast. For instance, a bright region in the difference image corresponds to a larger difference which may indicate a more dynamic averaging and dark regions may indicate CSF which exhibits low levels of dynamic averaging and thus low sensitivity to the type of pulse applied in the pulse train.

The present subject matter provides a contrast for MR imaging and provides a method and system to increase the persistence of the signal as well as enhance sensitivity because the signal decays more slowly. Detection and identification of progression of diseases such as breast cancer, brain tumor and stroke detection and plaque formation are exemplary applications for the present subject matter.

In one example, both the $B_1$ field and the radio frequency sweep is a function of time. By modulating the pulse, the contribution to relaxation can be modulated. For instance, pulse modulation allows modulation of the exchange and the dipole contributions. The pulses of the pulse train can be modulated in many ways including phase, frequency and amplitude.

For example, by changing the amplitude of the radio frequency pulse, the relaxation process reveals sensitivity to changes in pH level. Such a mechanism for contrast using MR imaging may be useful for detection of cancerous cells since cancer cells typically have a low extracellular pH and benign tumors don't have an acidic extracellular pH.

In one example, plaque can be distinguished from other tissue by configuring the pulse sequence in terms of pulse length, peak power, pulse modulation function and interpulse time interval. As another example, a particular body part or tissue can be examined by suitably configuring the pulse sequence. The relaxation is measured during the radio frequency adiabatic pulse wherein the pulse is modulated over time.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separate embodiment.

What is claimed:

1. A system comprising:
a signal generator configured to couple with a magnetic resonance transmitter coil; and
a processor configured to execute instructions to control the signal generator, the instructions including forming a sequence having an adiabatic pulse train and an excitation pulse, the sequence configured to generate a magnetic resonance signal that decays by relaxing in a rotating frame of reference.

2. The system of claim 1 wherein the adiabatic pulse train includes a plurality of pulses, at least one of which satisfies an adiabatic condition and having a duration and a waveform.

3. The system of claim 2 wherein the duration of at least two pulses of the plurality of pulses are different.

4. The system of claim 2 wherein the waveform of at least two pulses of the adiabatic pulse train are different.

5. The system of claim 1 wherein an interpulse interval between two pulses of the adiabatic pulse train is substantially zero.

6. The system of claim 1 wherein the instructions including applying the adiabatic pulse train before applying the excitation pulse.

7. The system of claim 1 wherein the instructions including applying the excitation pulse before applying the adiabatic pulse train.

8. The system of claim 1 wherein the instructions including generating and applying a slice selection pulse.

9. The system of claim 1 further including a controller coupled to the processor, the controller configured to receive a user selection.

10. The system of claim 9 wherein the controller is configured to receive a selection as to a modulation function for the sequence.

11. The system of claim 9 wherein the controller is configured to receive a selection as to a relaxation parameter, wherein the sequence is configured as a function of the selected relaxation parameter.

12. The system of claim 1 further including:
a receiving coil; and
an output device coupled to the receiving coil, the output device configured to display data based on the magnetic resonance signal.

13. A method comprising:
sequentially applying an adiabatic first pulse train and an excitation pulse to a region of interest in a static magnetic field, the first pulse train having a plurality of pulses each of which has a pulse duration and a waveform wherein the waveform is configured to produce a modulated effective field vector; and
generating data based on a magnetic resonant signal received from the region of interest, the data corresponding to relaxation in a rotating frame of reference, the relaxation based on the waveform.

14. The method of claim 13 wherein a pulse duration of a first pulse of the plurality of pulses differs from a pulse duration of a second pulse of the plurality of pulses.

15. The method of claim 13 wherein a waveform of a first pulse of the plurality of pulses differs from a waveform of a second pulse of the plurality of pulses.

16. The method of claim 13 further including sequentially applying a second pulse train to the region of interest, the second pulse train having a plurality of pulses each of which has a pulse duration and a waveform wherein the waveform is configured to produce a modulated effective field vector, and wherein the second pulse train differs from the first pulse train.

17. The method of claim 13 wherein the first pulse train includes an adiabatic full passage pulse.

18. The method of claim 13 wherein the excitation pulse includes an adiabatic half passage pulse.

19. The method of claim 13 wherein the first pulse train is applied before the excitation pulse.

20. The method of claim 13 wherein the excitation pulse is applied before the first pulse train.

21. The method of claim 13 further including applying at least one slice selection pulse.

22. The method of claim 21 wherein generating data includes simultaneously receiving the signal and applying the at least one slice selection pulse.

23. The method of claim 13 wherein generating data includes at least one of forming an image and forming spectroscopy data.

24. A method comprising:

applying a pulse sequence to a specimen, the pulse sequence including an adiabatic pulse train and an excitation pulse, the adiabatic pulse train having a plurality of pulses;

receiving a magnetically resonant excited signal from the specimen; that decays by relaxing in a rotating frame of reference and determining a measure of relaxation based on the signal.

25. The method of claim 24 wherein the sequence includes the adiabatic pulse train followed by the excitation pulse.

26. The method of claim 24 wherein the sequence includes the excitation pulse followed by the adiabatic pulse train.

27. The method of claim 24 further including:

selecting a relaxation mechanism from a plurality of mechanisms; and configuring the sequence based on the selected relaxation mechanism.

28. The method of claim 27 wherein configuring the sequence includes at least one of selecting an order for the adiabatic pulse train and the excitation pulse, selecting a modulation function for the adiabatic pulse train, selecting a modulation function for the excitation pulse, selecting a pulse duration, and selecting a pulse power level.

29. The method of claim 24 wherein the adiabatic pulse train includes a plurality of adiabatic full passage pulses.

30. The method of claim 24 wherein the excitation pulse includes an adiabatic half passage pulse.

* * * * *